US006855919B2

(12) United States Patent
Taguchi

(10) Patent No.: US 6,855,919 B2
(45) Date of Patent: Feb. 15, 2005

(54) HIGH-FREQUENCY CURRENT GENERATING CIRCUIT AND CONTROL DEVICE FOR CONTROLLING LIGHT INTENSITY OF LASER DIODE

(75) Inventor: Toyoki Taguchi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 120 days.

(21) Appl. No.: 10/281,193

(22) Filed: Oct. 28, 2002

(65) Prior Publication Data

US 2003/0052250 A1 Mar. 20, 2003

Related U.S. Application Data

(62) Division of application No. 09/602,893, filed on Jun. 23, 2000, now Pat. No. 6,489,600.

(30) Foreign Application Priority Data

Jun. 25, 1999 (JP) ............................................. 11-180591
Oct. 19, 1999 (JP) ............................................. 11-297014

(51) Int. Cl.[7] .............................. H01S 3/00; H01J 40/14
(52) U.S. Cl. ................ 250/205; 250/214 R; 372/38.02; 369/116
(58) Field of Search ............................ 250/205, 214 R, 250/214 A, 214 LA, 214 LS; 372/32, 33, 338.01, 38.02, 38.07, 38.08; 369/59.11, 53.26, 116, 121

(56) References Cited

U.S. PATENT DOCUMENTS

| | | | | |
|---|---|---|---|---|
| 4,819,242 A | * | 4/1989 | Kaku et al. ................ | 372/38.02 |
| 5,127,015 A | * | 6/1992 | Chikugawa et al. ...... | 372/29.01 |
| 5,848,044 A | * | 12/1998 | Taguchi et al. ........... | 369/53.26 |
| 6,011,768 A | | 1/2000 | Taguchi | |
| 6,111,901 A | * | 8/2000 | Taguchi et al. ........... | 372/38.02 |

FOREIGN PATENT DOCUMENTS

| | | |
|---|---|---|
| JP | 58-7941 | 1/1983 |
| JP | 62-86882 | 4/1987 |
| JP | 62-236150 | 10/1987 |
| JP | 4-260382 | 9/1992 |
| JP | 6-84198 | 3/1994 |
| JP | 6-132591 | 5/1994 |
| JP | 6-274918 | 9/1994 |
| JP | 7-106673 | 4/1995 |
| JP | 7-327054 | 12/1995 |
| JP | 10-247329 | 9/1998 |

OTHER PUBLICATIONS

Elantec High Performance Analog Integrated Circuits, pp. 1 to 9, "EL6200C Preliminary 450 MHZ HFM Oscillator", Mar. 19, 1999.

* cited by examiner

Primary Examiner—Kevin Pyo
(74) Attorney, Agent, or Firm—Oblon, Spivak, McClelland, Maier & Neustadt, P.C.

(57) ABSTRACT

In a laser-driving device including a high-frequency current generating circuit generating a high-frequency current superimposed on a control current output from a light intensity control circuit for light intensity control, and supplied to a laser diode as a drive current, the high-frequency current generating circuit has a sourcing current source, a sinking current source, current switches connected between the current sources and a drive output terminal respectively, a gated oscillation circuit oscillating with a desired frequency, and switch drive circuits complementarily on/off controlling the current switches by using a drive switching signal obtained by removing a high-frequency component from an output signal of the oscillation circuit. The present invention, therefore, provides a high-frequency current generating circuit which can increase the amplitude of the high-frequency current superimposed on the control current of the laser diode and which generates less heat while suppressing power consumption.

8 Claims, 12 Drawing Sheets

HIGH-FREQUENCY CURRENT GENERATING CIRCUIT AND CONTROL DEVICE FOR CONTROLLING LIGHT INTENSITY OF LASER DIODE

CROSS-REFERENCE TO RELATED APPLICATIONS

This application is a division of application Ser. No. 09/602,893, filed Jun. 23, 2000, now U.S. Pat. No. 6,489,600.

This application is based upon and claims the benefit of priority from the prior Japanese Patent Applications No. 11-180591, filed Jun. 25, 1999; and No. 11-297014, filed Oct. 19, 1999, the entire contents of which are incorporated herein by reference.

BACKGROUND OF THE INVENTION

The present invention relates to a high-frequency current generating circuit for reading a signal recorded on an optical-recording medium which is a disk-type data storage medium (to be referred to as "optical disk" hereinafter) from/to which information is read and/or written by a laser beam, and relates to a controller for controlling the light intensity of a laser diode.

Recently, optical disk devices such as a CD-ROM (Compact Disk Read-Only Memory) device, a CD-R (Compact Disk Recordable) device, a CD-RW (Compact Disk Rewritable) device and DVD (Digital Versatile Disk) device, are widely used as storage devices provided externally of, for example, a personal computer which is an information processor for processing information. In addition, portable equipment such as a notebook computer handy to carry and mobile equipment which is easily movable, are popular. As a consequence, demand for increasing the storage capacitance of an optical disk device installed in these mobile equipment and for making the optical disk smaller in size, thinner and lighter, is rising.

Among constituent elements of an optical disk device, an optical pickup device for reading a signal recorded on an optical disk, includes many optical components and elements such as a laser diode emitting a laser beam by means of a semiconductor, an objective lens for converging the laser beam of the laser diode, a mirror for reflecting the laser beam, a hologram element for interfering with the laser beam and a light detector for detecting a laser beam. The capacitance and weight of these components and elements are large in an overall optical disk device. For that reason, to provide a smaller, thinner and lighter optical disk device largely depends on the optical pickup device. Due to this, various improvements have been hitherto made for optical pickup devices.

When a laser diode is employed in an optical pickup device, a problem of occurrence of so-called return-light noise arises. The occurrence of the return-light noise is a phenomenon that when a light beam emitted from the laser diode is applied onto an optical disk, a part of the reflected light returns from a optical disk surface to the laser diode to thereby generate noise. Since the laser diode is oscillated in a single mode having a single frequency, mode hopping that is frequency changes occurs when there is return-light. Then, the intensity of output light varies greatly, and return-light noise occurs as stated above.

To reduce return-light noise, the variation of the intensity of light may be prevented even if mode hopping occurs. To do so, there is known a method in which a laser of a laser diode is oscillated in multiple modes having two or more frequencies. According to this method, a high-frequency current having a frequency of 200 MHz or higher is superimposed on a control current for controlling the laser diode. The high-frequency current superimposed on the control current is a drive current for driving the laser diode. Consequently, the laser of the laser diode is oscillated in multiple modes by the drive current, and return-light noise is thereby reduced. In this case, the amplitude of the high-frequency current is not less than 20 to 30 mA.

When the above-stated method is carried out, it is preferable that an integrated circuit for generating a high-frequency current is arranged in the vicinity of the laser diode so as to reduce a driving loss and to make an optical pickup device smaller and thinner. This circuit, however, generates considerable heat. For example, the power supply voltage of a high-frequency current generating circuit is generally 5V, and power consumption thereof is not less than 300 mw. The laser diode has such properties that light emission characteristics deteriorate in a high temperature environment, and in particular, the laser diode may not emit light at a temperature of 80° C. or higher. It is, therefore, difficult to arrange the high-frequency current generating circuit in the vicinity of the laser diode. Nevertheless, a circuit for effectively reducing the power consumption of a high-frequency generation circuit is realized as disclosed by, for example, Japanese Patent Unexamined Application Publication (KOKAI) No. 10-247329. The circuit disclosed therein allows a high-frequency current generating circuit to be arranged in the vicinity of a laser diode. Additionally, according to Elantec Homepage (http://www.elantec.com), two output current loops circuit for reducing power consumption is shown on "EL6200C Preliminary Mar. 19, 1999", page 6, FIG. 2.

However, to further accelerate data transmission rate at the time of reading data, the frequency of the high-frequency current is required to be as high as 300 to 500 MHz.

On the other hand, laser diodes can be produced at lower cost and operated at higher temperature, so that a junction capacitance thereof tends to be higher. When the frequency of such a superimposed high-frequency current increases and so does the junction capacitance of the laser diode increase, driving loss rises. If so, the amplitude of the superimposed high-frequency current needs to be increased further. As a result, the power consumption of the high-frequency current generating circuit increases, thereby making it quite difficult to arrange a high-frequency current generating circuit in the vicinity of the laser diode.

Meanwhile, a DVD drive or CD drive is provided with an optical system including a red laser diode (wavelength=650 nm) for reading data on the DVD and an optical system including a near-infrared laser diode (wavelength=780 nm) for reading data on the CD-R/RW. In an optical disk device provided with these two laser diodes emitting different wavelength light, two independent high-frequency current generating circuits corresponding to the respective laser diodes are prepared. This possibly leads to an increase in the size of an integrated circuit including a high-frequency current generating circuit for generating a high-frequency current and to hike cost up. At present, the development of a laser diode which emits a laser beam due to two wavelengths being switched is undergone. Even so, the same disadvantages occur if two independent high-frequency current generating circuits corresponding to the respective wavelength are provided.

Generally, an auto-power control (APC) is employed in the drive system of the laser diode. Specifically, a part of the light emitted from the laser diode is received by a light detector for monitoring the intensity of light and the output current is converted into a voltage by a current-to-voltage conversion resistor. Thereafter, the converted voltage is supplied to an APC circuit as a control signal for controlling the light intensity. The APC circuit generates a control current for controlling the intensity of light emitted from the laser diode. A high-frequency current stated above is superimposed on this control circuit. The laser diode and the light intensity monitored light detector are packaged in the same package.

When this APC is applied to the optical disk device provided with the two laser diodes having a different wavelength stated above, the following disadvantages occur. The first disadvantage is caused by providing light detectors for monitoring the intensity of light, these detectors being individually provided to correspond to the respective laser diodes. If so, the number of pins of the package for packaging the laser diode and the light detector of monitoring light intensity, disadvantageously increases. Another disadvantage is that if a monolithic structure in which two laser diodes are formed in one chip is employed, this structure requires an optical device, such as a dichroic prism, having wavelength selectiveness and separating an optical path so as to separate light of the respective wavelength from each other and to allow the separated light to be incident on the respective light-monitoring detectors. As a result, the size of the package becomes large. These disadvantages are serious obstructions to realizing a smaller, thinner and lighter optical pickup device.

It is considered that these disadvantages can be overcome by employing a light detector for monitoring light intensity, this detector being common to two laser diodes. The detection sensitivity of a light detector is normally dependent on wavelength of light, and an output current of the light detector varies according to the wavelength of an incident light with a fixed intensity of light. Accordingly, in one light-monitoring detector, it is difficult to accurately control the intensity of light of each laser diode.

As described above, according to the conventional high-frequency current superposition technique, if the frequency of the high-frequency current superimposed on the control current of the laser diode increases due to high rate of transmitting data, the junction capacitance of the laser diode increases and thereby driving loss increases, then it is required to increase the amplitude of the superimposed high-frequency current. Consequently, the power consumption of the high-frequency current generating circuit increases to thereby generate more heat. It is, therefore, difficult to provide a smaller, thinner optical pickup device by providing a high-frequency current generating circuit in the vicinity of a laser diode.

BRIEF SUMMARY OF THE INVENTION

The main object of the present invention is to provide a high-frequency current generating circuit included in a semiconductor integrated circuit, this current generating circuit being able to increase the amplitude of a high-frequency current superimposed on the control current of a laser diode and generate less heat while suppressing power consumption, and control device for controlling light intensity of laser diode.

Another object of the present invention is to provide a high-frequency current generating circuit included in a semiconductor integrated circuit, this current generating circuit being able to generate a high-frequency current superimposed on the control current of a laser diode emitting a laser selected from two lasers having a different wavelength, with a circuit size as small as possible.

Yet another object of the present invention is to provide a light intensity control device and a semiconductor integrated circuit which can individually control light intensity of the laser diode of two wavelengths by using a common light-monitoring detector.

According to the present invention, there is provided a high-frequency current generating circuit for generating a high-frequency current, incorporated into a driving device for driving a laser diode by using a drive signal obtained by superimposing the high-frequency current on a control current for controlling an output of the laser diode, the high-frequency current generating circuit comprising:

an output terminal configured to output the high-frequency current;

a first current source including a first capacitor and a first MOSFET, configured to generate a first current and outputting the first current to the output terminal;

a second MOSFET configured to control an output of the first current from the first current source to the output terminal, the second MOSFET having a first gate-input capacitance and being connected between the first current source and the output terminal;

a first control circuit including a third MOSFET and a first resistor connected to the third MOSFET and constituting a first low-pass filter, together with the first gate-input capacitance of the second MOSFET, the first control circuit supplying a first gate signal to the second MOSFET through the first low-pass filter, the third MOSFET and the first resistor being arranged in series;

a second control circuit including a fourth MOSFET and a second resistor connected to the fourth MOSFET and constituting a second low-pass filter, together with the first gate-input capacitance of the second MOSFET, the second control circuit supplying a second gate signal to the second MOSFET through the second low-pass filter, the fourth MOSFET and the second resistor being arranged in series;

a second current source including a second capacitor and a fifth MOSFET, configured to generate a second current and input the second current from the output terminal;

a sixth MOSFET configured to control an output of the second current from the second current source to the output terminal, the sixth MOSFET having a second gate-input capacitance and being connected between the second current source and the output terminal;

a third control circuit including a seventh MOSFET and a third resistor connected to the seventh MOSFET and constituting a third low-pass filter, together with the second gate-input capacitance of the sixth MOSFET, the third control circuit supplying a third gate signal to the sixth MOSFET through the third low-pass filter, the seventh MOSFET and the third resistor being arranged in series;

a fourth control circuit including an eighth MOSFET and a fourth resistor connected to the eighth MOSFET and constituting a fourth low-pass filter, together with the second gate-input capacitance of the sixth MOSFET, the fourth control circuit supplying a fourth gate signal to the sixth MOSFET through the fourth low-pass filter, the eighth MOSFET and the fourth resistor being arranged in series;

an oscillation circuit configured to output an oscillation signal having a predetermined frequency; and a fifth control circuit configured to alternately supply the first and second gate signals to the second MOSFET based on the oscillation signal, and alternately supply the third and fourth gate signals to the sixth MOSFET based on the oscillation signal.

Further, according to the present invention, there is provided a high-frequency current generating circuit for generating a high-frequency current, incorporated into a driving device for driving a laser diode by using a drive signal obtained by superimposing the high-frequency current on a control current for controlling an output of the laser diode, the high-frequency current generating circuit comprising:

an output terminal configured to output the high-frequency current;

a first sourcing current source configured to generate a first current, and output the first current to the output terminal;

a first current switch configured to control an output of the first current from the first sourcing current source to the output terminal, the first current switch being connected between the first sourcing current source and the output terminal;

a second sinking current source configured to generate a second current, and input the second current from the output terminal;

a second current switch configured to control an output of the second current from the second sinking current source to the output terminal, the second current switch being connected between the second sinking current source and the output terminal;

a control circuit configured to alternately on/off control the first and second current switches, the control circuit being connected to the first and second circuit switches; and a detection oscillation circuit configured to detect the control current, and output an oscillation signal selectively when the laser diode is turned on, the detection oscillation circuit being connected to an input terminal of the control circuit.

Moreover, according to the present invention, there is provided a high-frequency current generating circuit driving device for driving a laser diode by using a drive signal for driving one of first and second laser diodes having different wavelengths of emitting light obtained by superimposing the high-frequency current on a control current for controlling an output of the laser diode, the high-frequency current generating circuit comprising:

a detection oscillation circuit configured to detect whether the first and second laser diodes are turned on/off while referring to a voltage value generated based on the control current, and output an oscillation signal corresponding to the wavelength of the laser diode being turned on; and two high-frequency current generation units configured to input an output signal of the detection oscillation circuit, and output the high-frequency current, wherein each of the two high-frequency current generation units comprises:

an output terminal configured to output the high-frequency current;

a first sourcing current source configured to generate a first current, and output the first current to the output terminal;

a first current switch configured to control an output of the first current from the first sourcing current source to the output terminal, the first current switch being connected between the first sourcing current source and the output terminal;

a second sinking current source configured to generate a second current, and input the second current from the output terminal;

a second current switch configured to control an output of the second current from the second sinking current source to the output terminal, the second current switch being connected between the second sinking current source and the output terminal; and a control circuit configured to alternately on/off control the first and second current switches, the control circuit being connected to the first and second current switches.

Still, according to the present invention, there is provided a light-intensity controlling device of laser diode comprising:

a light detector configured to detect light of one of first and second laser diodes being driven, and generate an output current corresponding to a light intensity of the detected light;

first and second current-to-voltage conversion resistors provided to correspond to the first and second laser diodes, respectively, the first and second current-to-voltage conversion resistors for converting the output current of the light detector into a voltage;

a determination circuit configured to determine whether the first and second laser diodes are turned on/off;

a resistor-selecting circuit configured to select one current-to-voltage conversion resistor corresponding to the laser diode determined to be turned on by the determination circuit from the first and second current-to-voltage conversion resistors; and an output control circuit configured to control light intensities of the first and second laser diodes based on a voltage obtained by current-to-voltage conversion by one of the resistors selected from the first and second current-to-voltage conversion resistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A shows the waveform of a state-determining signal output from a voltage comparator shown in FIG. 1;

FIG. 2B shows the waveform of the output signal of a G-VCO shown in FIG. 1;

FIG. 2C shows the waveform of the output signal of an OR gate shown in FIG. 1;

FIG. 2D shows the waveform of the output signal of an AND gate shown in FIG. 1;

FIG. 2E shows the waveform of an current I1 flowing from a sourcing current source shown in FIG. 1;

FIG. 2F shows the waveform of an current I1 flowing into the sinking current source shown in FIG. 1;

FIG. 2G shows the waveform of a current Iout output from the high-frequency current generating circuit shown in FIG. 1;

DETAILED DESCRIPTION OF THE INVENTION

The embodiments of the present invention will be described hereinafter with reference to the accompanying drawings.

(First Embodiment)

Figure 1:
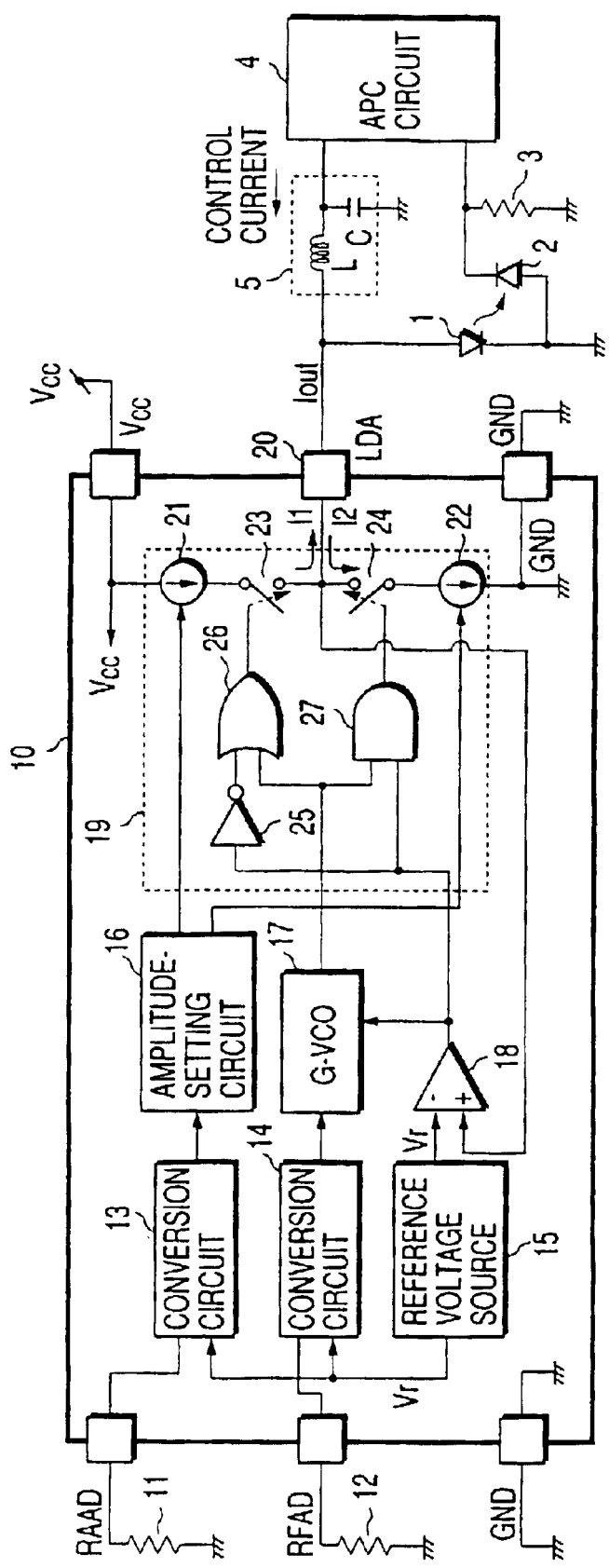
FIG. 1 is a circuit diagram showing the schematic configuration of a semiconductor device including a high-frequency current generating circuit according to the first embodiment of the present invention.

FIG. 1 is a circuit diagram showing the overall arrangement of a semiconductor device including a high-frequency current generating circuit according to the present invention.

This semiconductor device consists of a laser diode 1, a light-monitoring detector 2 for monitoring light intensity, a current-to-voltage conversion resistor 3, an APC (auto-power control) circuit 4, a high-frequency blocking filter 5 and a high-frequency current generating circuit 10.

The laser diode 1 constitutes, for example, the light source of an optical system unit to be described later and generates a laser beam to be applied onto an optical disk such as a DVD. Part of the light emitted from the laser diode 1 is received by the light-monitoring detector 2. The light-monitoring detector 2 is, for example, a photo-diode. The detector 2 detects the intensity of light emitted from the laser diode and generates a corresponding output current. The output current of the light-monitoring detector 2 is converted into a voltage by the current-to-voltage conversion resistor 3 and supplied to the APC circuit 4 as a control signal for controlling the intensity of light.

The APC circuit 4 generates a control current for controlling the intensity of light emitted from the laser diode 1. This control current is used as a main drive current for the laser diode 1 and supplied through the high-frequency blocking filter 5 consisting of a capacitor C and an inductor L to the anode terminal of the laser diode 1. The cathode terminal of the laser diode 1 is earthed as well as the anode terminal of the light-monitoring detector 2 (photo-diode). The intensity of light emitted from the laser diode 1 is controlled to a desired certain value by a feedback loop of laser diode 1→ light-monitoring detector 2→current-to-voltage conversion resistor 3→APC circuit 4→filter 5→laser diode 1.

In this case, the light intensity of the laser diode 1 can be adjusted by the value of the current-to-voltage conversion resistor 3. Namely, even if the light intensity of the laser diode 1 is the same, the magnitude of the voltage between the both ends of the current-to-voltage conversion resistor 3, i.e., the magnitude of the control signal input to the APC circuit 4 is changed by changing the value of the current-to-voltage conversion resistor 3. Therefore the light intensity controlled by the APC circuit 4 is changed as well.

The high-frequency current generating circuit 10 is a circuit generating a high-frequency current to be superimposed on the control current supplied from the APC circuit 4 to the laser diode 1. The high-frequency current generating circuit 10 is constituted by an integrated circuit, which consists of voltage-to-current conversion circuit 13 and 14 connected to a current-amplitude setting resistor 11 and a frequency-setting resistor 12 each consisting of an external resistor provided externally of the integrated circuit, a reference voltage source 15, an amplitude-setting circuit 16, a gated-voltage controlled oscillator (G-VCO) 17, a voltage comparator 18 and a drive circuit 19 which is in the final stage of the circuit.

The drive circuit 19 has a drive output terminal 20 for outputting a high-frequency current. The drive output terminal 20 is connected to the anode terminal of the laser diode 1. In the drive circuit 19, the first sourcing current source 21 and the first current switch 23 are connected in series between the drive output terminal 20 and a positive power source Vcc, and the second current switch 24 and the second sinking current source 22 are connected in series between the drive output terminal 20 and a earthed GND.

Further, an inverter 25, an OR gate 26 and an AND gate 27 as a switch drive circuit for on/off controlling the current switches 23 and 24, are provided in the drive circuit 19.

[High-frequency Current Generating Circuit 10]

Next, referring to the waveform view shown in FIGS. 2A to 2G, the more detailed configuration and operation of the high-frequency current generating circuit 10 will be described.

The voltage-to-current conversion circuit 13 generates an amplitude-setting current which is a reference current for setting the amplitude of a high-frequency current output from the high-frequency current generating circuit 10 based on the external current-amplitude setting resistor 11 and a reference voltage Vr from a reference voltage source 15. This amplitude-setting current is converted into a voltage by the amplitude-setting circuit 16 and supplied to the input terminals on the current sources 21 and 22.

Another voltage-to-current conversion circuit 14 generates a frequency-setting current which is a reference current for setting the frequency of a high-frequency current output from the high-frequency current generating circuit 10 based on the external frequency-setting resistor 12 and the reference voltage Vr from the reference voltage source 15. The frequency-setting current is supplied to the input terminal on a G-VCO 17.

The G-VCO 17 is a rectangular wave oscillation circuit capable of on/off controlling an oscillation operation by a signal input to a input terminal for controlling a gate of G-VCO 17. In this embodiment, the output of the voltage comparator 18 is input to the input terminal for controlling a gate. The voltage comparator 18 decides whether the laser diode 1 is in an operating state or non-operating state by monitoring the terminal voltage of the drive output terminal 20. That is to say, the voltage comparator 18 compares the terminal voltage of the drive output terminal 20 with the reference voltage Vr from the reference voltage source 15, and thereby outputs a state-determining signal indicting whether the laser diode 1 is in an operating state or non-operating state.

Figure 2A:
FIGS. 2A to 2G are waveform diagrams for describing the operation of the high-frequency current generating circuit shown in FIG. 1.
Figure 2B:

As indicated by the waveform of the state-determining signal output from the voltage comparator 18 shown in FIG. 2A and the output waveform of the G-VCO 17 shown in FIG. 2B, the G-VCO 17 is constituted to perform an oscillation operation when the state-determining signal output from the voltage comparator 18 becomes an "H" level indicating that the laser diode 1 is in an operating state and to stop the oscillation operation when the laser diode 1 becomes an "L" level indicating that the laser diode 1 is in a non-operating state. The oscillation output of the G-VCO 17 is a rectangular wave signal as show in FIG. 2B and the frequency thereof is determined by the frequency-setting current output from the voltage-to-current conversion circuit 14.

The rectangular wave signal which is the oscillation output of the G-VCO 17 is supplied to one of the input terminals of each of the OR gate 26 and the AND gate 27 in the drive circuit 19. A signal inverting the output signal of the voltage comparator 18 by the inverter 25 is supplied to the other input terminal of the OR gate 26. The output of the voltage comparator 18 is supplied to the other input terminal of the AND gate 27.

Figure 2C:
Figure 2D:

Namely, the OR gate 26 and the AND gate 27 control on/off of the oscillation output signal of the G-VCO 17 by the state-determining signal output from the voltage comparator 18. As shown in FIGS. 2C and 2D, basically the same output as the oscillation output of the G-VCO 17 shown in FIG. 2B is output from each of the OR gate 26 and the AND gate 27. The output of the OR gate 26 is fed to the control input terminal of the first current switch 23 and the output of the AND gate 27 is fed to the control input terminal of the second current switch 24.

Figure 2E:
Figure 2F:
Figure 2G:

The OR gate 26 turns on the current switch 23 when the oscillation output of the G-VCO 17 is at "L" level. By doing so, as shown in FIG. 2E, the output current I1 of the sourcing current source 21 is supplied to the drive output terminal 20 through the current switch 23. The AND gate 27 turns on the current switch 24 when the oscillation output of the G-VCO 17 is at "H" level. By doing so, as shown in FIG. 2F, a current I2 is drawn to the sinking current source 22 through the current switch 24 from the drive output terminal 20. As shown in FIG. 2B, the oscillation output of the G-VCO 17 repeats "H level" and "L level" in an oscillation cycle, and the current switches 23 and 24 are alternatively or complementarily turned on and off accordingly. Thus, at the drive output terminal 20, sourcing current and sinking current are alternately output. As shown in FIG. 2G, therefore, a high-frequency current $I_{out}$ which is a composite current of the current waveforms of FIGS. 2E and 2F without DC offset is output from the drive output terminal 20.

The high-frequency current $I_{out}$ output from the drive output terminal 20 is superimposed on the control current output from the APC circuit 4 and supplied to the anode terminal of the laser diode 1. At this moment, the high-frequency current is also supplied to the output side of the high-frequency blocking filter 5. However, the high-frequency current is blocked by the inductor L of the filter 5. Accordingly, the high-frequency current is not transmitted to the APC circuit 4, but most of the high-frequency current is supplied to the laser diode 1.

The terminal voltage of the drive output terminal 20 becomes the operating voltage of the laser diode 1 (normally 2V to 3V) when the laser diode 1 is supplied with the control current from the APC circuit 4, and becomes zero when no control current is supplied to the laser diode 1. Owing to such a voltage change of the anode terminal of the laser diode 1, the voltage comparator 18 in the high-frequency current generating circuit 10 compares the terminal voltage of the drive output terminal 20 connected to the anode terminal with the reference voltage Vr from the reference voltage source 15, and generates a state-determining signal indicating whether the laser diode 1 is in an operating state or non-operating state.

The state-determining signal output from the voltage comparator 18 is supplied to the input terminal for controlling a gate of the G-VCO 17, to the OR gate 26 through the inverter 25 and further to the AND gate 27. Consequently, when the laser diode 1 is in an operating state, the G-VCO 17 performs an oscillation operation, and the current switches 23 and 24 in the drive circuit 19 are turned on and off according to the oscillation output of the G-VCO 17. When the laser diode 1 is in a non-operating state, the oscillation operation of the G-VCO 17 is stopped, and the current switches 23 and 24 are turned off.

In other words, when the output signal of the voltage comparator 18 becomes "H" level after the terminal voltage of the drive output terminal 20 exceeds the reference voltage Vr as shown in FIG. 2A, the G-VCO 17 performs an oscillation operation as shown in FIG. 2B, and the OR gate 26 and the AND gate 27 allow the oscillation output of the G-VCO 17 to be passed therethrough and to be supplied to the control input terminals of the current switches 23 and 24, respectively. As a result, the current switches 23 and 24 carry out switching operations complementarily according to the oscillation output of the G-VCO 17 and alternately connect the sourcing current source 21 and the sinking current source 22 to the drive output terminal 20. Due to this, as shown in FIGS. 2E and 2F, currents I1 and I2 flow through the current switches 23 and 24. The currents I1 and I2 are composed to thereby output a high-frequency current Iout from the drive output terminal 20 as shown in FIG. 2G. The high-frequency current $I_{out}$ is superimposed on the control current flowing to the laser diode 1 and supplied thereto.

On the other hand, when the terminal voltage of the drive output terminal 20 falls below the reference voltage Vr and the output signal of the voltage comparator 18 becomes "L" level, the G-VCO 17 stops its oscillation operation, and the output of the OR gate 26 turns into "H" level and that of the AND gate 27 turns into "L" level. The current switches 23 and 24 are kept turned off and no high-frequency current is output from the drive output terminal 20.

In this way, referring to the output signal of the voltage comparator 18 for monitoring the terminal voltage of the drive output terminal 20, the oscillation operation of the G-VCO 17 is turn on and off and the operations of the current switches 23 and 24 of the drive circuit 19 are controlled. By doing so, it becomes unnecessary to prepare a special control signal for controlling the high-frequency current generating circuit 10 in association with the light-emitting operation of the laser diode 1. It is, therefore, possible to reduce cost and to make power consumption in a non-operating state almost zero to thereby obtain a greater power-saving effect.

[Amplitude-setting Circuit 16 and Drive Circuit 19 in High-frequency Current Generating Circuit 10]

Figure 3:
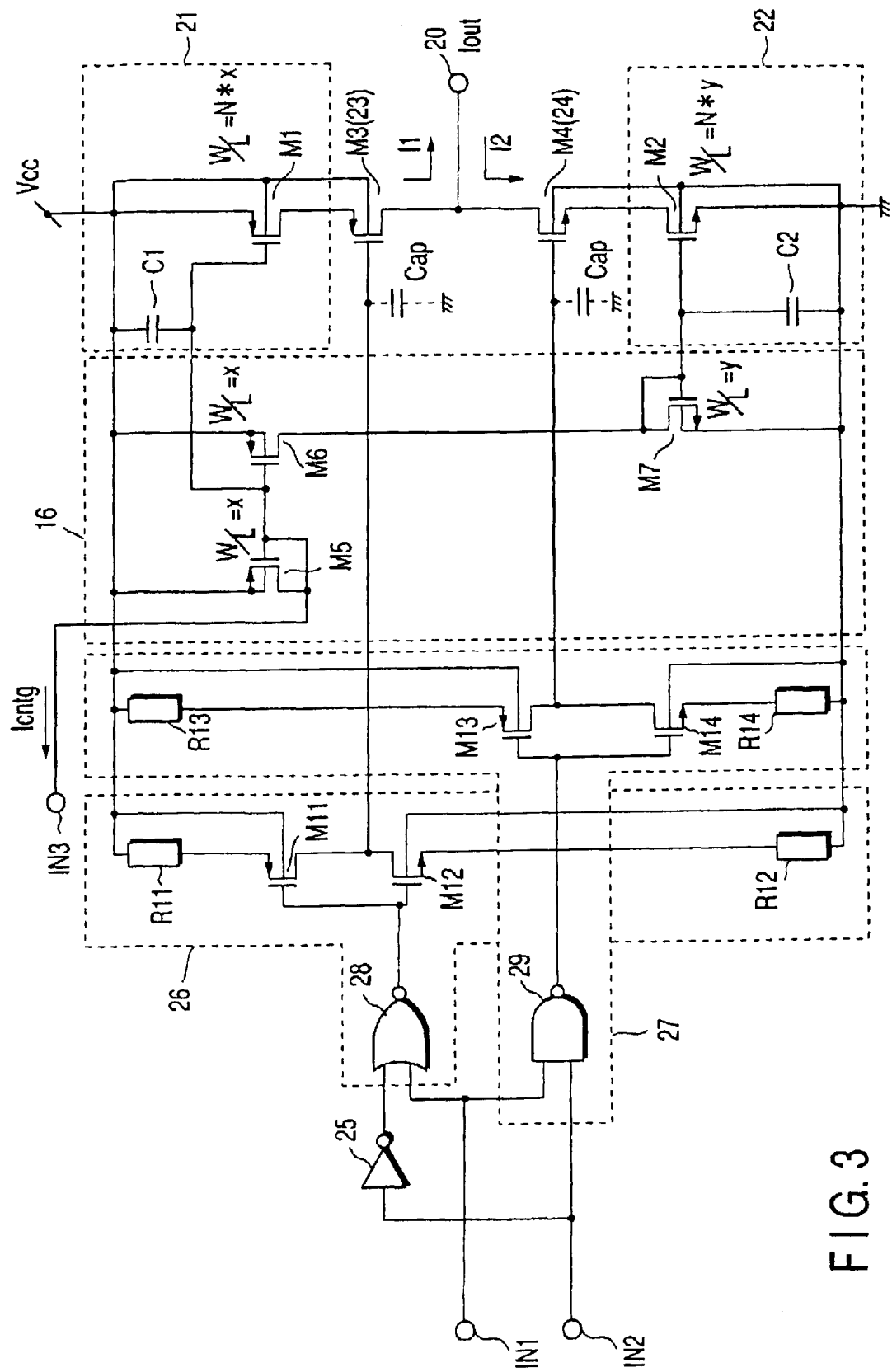
FIG. 3 is a circuit diagram showing the more concrete configuration of the high-frequency current generating circuit shown in FIG. 1.

Next, referring to the circuit diagram shown in FIG. 3, the amplitude-setting circuit 16 and the drive circuit 19 shown in FIG. 1 will be described in detail. It is noted that a P-channel MOS transistor will be referred to as "PMOS transistor" and an N-channel MOS transistor will be referred to as "NMOS transistor" in the following description. FIG. 3 also illustrates the relationship between gate width and gate length, W/L (gate width/gate length), in the sizes of five MOS transistors.

As shown in FIG. 3, the sourcing current source 21 consists of a PMOS transistor M1 having a source terminal connected to a power source Vcc and a capacitor C1 connected between the source terminal and gate terminal of the transistor M1. The sinking current source 22 consists of an NMOS transistor M2 having a source terminal connected to the earthed GND and a capacitor C2 connected between the source terminal and gate terminal of the transistor M2. The capacitors C1 and C2 are provided to stabilize the high-frequency current $I_{out}$ output from the drive output terminal 20 or, to be specific, to improve the distortion in output waveform of a high-frequency current to be described later.

The first current switch 23 is a PMOS transistor M3. The source terminal of the transistor M3 is connected to the drain terminal of the transistor M1 and the drain terminal thereof is connected to the drive output terminal 20. The second current switch 24 is an NMOS transistor M4. The source terminal of this transistor M4 is connected to the drain terminal of the transistor M2 of the sinking current source 22 and the drain terminal thereof is connected to the drive output terminal 20. Reference symbol Cap denotes the gate-input capacitance of each of the transistors M3 and M4.

The amplitude-setting circuit 16 consists of PMOS transistors M5, M6 and an NMOS transistor M7. An amplitude-setting current $I_{cntg}$ supplied from the voltage-to-current conversion circuit 13 shown in FIG. 1 to an input terminal IN3 is supplied to the gate terminal of the diode-connected PMOS transistor M5 (diode-connection indicates that a gate and a train are connected) and thereby converted into a voltage. The resultant voltage is supplied to the PMOS transistor M6 forming, together with the PMOS transistor M5, a current mirror and to the gate terminal of the PMOS transistor M1 of the sourcing current source 21 forming, together with the PMOS transistor M5, a current mirror.

The PMOS transistor M6 is the same in size as the PMOS transistor M5. The amplitude-setting current $I_{cntg}$ is inverted by the PMOS transistor M6. The amplitude-setting current $I_{cntg}$ thus inverted is supplied to the gate terminal of the diode-connected NMOS transistor M7 and thereby converted into a voltage. The resultant voltage is supplied to the gate terminal of the NMOS transistor M2 of the sinking current source 22 forming, together with the NMOS transistor M7, a current mirror.

The size ratio of the PMOS transistor M1 to the PMOS transistor M5 is selected to be N times. Due to this, the current of the sourcing current source 21 output from the drain terminal of the PMOS transistor M1 is N times as high as the amplitude-setting current $I_{cntg}$. This current is poured to the drive output terminal 20 when the PMOS transistor M3 of the current switch 23 is turned on.

Likewise, the size ratio of the NMOS transistor M2 of the sinking current source 22 to the NMOS Transistor M7 is selected to be N times. Due to this, when the NMOS transistor M4 of the current switch 24 is turned on, a current N times as high as the amplitude-setting current $I_{cntg}$ is sucked from the drive output terminal 20.

The OR gate 26 consists of an NOR gate 28, a PMOS transistor M11, an NMOS transistor M12 and band-limiting resistors R11 and R12. The OR gate 26 supplies an amplitude output (rectangular signal) from the G-VCO 17 shown in FIG. 1 to the gate terminal of the PMOS transistor M3 of the current switch 23.

The band-limiting resistors R11 and R12 limit a frequency band by removing the high-frequency components of the rectangular wave signal output from the OR gate 26 due to the influence of the gate-input capacitance Cap of the PMOS transistor M3, as broken line shown in FIG. 2C, and resistors R11 and R12 being functioning to deteriorate the rise and fall characteristics of a drive switching signal for driving the transistor M3 of the current switch 23.

The AND gate 27 consists of an NAND gate 29, a PMOS transistor M13, an NMOS transistor M14 and band-limiting resistors R13 and R14. The AND gate 27 supplies an oscillation output (rectangular wave signal) from the G-VCO 17 shown in FIG. 1 to the gate terminal of the NMOS transistor M4 of the current switch 24.

Similarly to the band-limiting resistors R11 and R12, the band-limiting resistors R13 and R14 limit a frequency band by removing the high-frequency components of the rectangular wave signal output from the AND gate 27 due to the influence of the gate-input capacitance Cap of the NMOS transistor M4, as shown in FIG. 2D, and function to deteriorate the rise and fall characteristics of a drive switching signal for driving the transistor M4 of the current switch 24.

In this way, the rise and fall characteristics of the drive switching signals supplied to the transistors M3 and M4 of the current switches 23 and 24 respectively are lowered by the band-limiting resistors R11, R12, R13 and R14, whereby it is possible to prevent occurrence of undesired switching noise and to greatly reduce the waveform distortion of the high-frequency current output.

The oscillation output from the G-VCO 17 shown in FIG. 1 is input to one input terminal IN1, and the state-determining signal output from the voltage comparator 18 shown in FIG. 1 is input to the other input terminal IN2. Here, when the input terminal IN2 is at "H" level, the oscillation output from the G-VCO 17 is supplied to the gate terminal of the PMOS transistor M3 of the current switch 23 through the OR gate 26, and also to the gate terminal of the NMOS transistor M4 of the current switch 24 through the AND gate 27. The gate terminal of the PMOS transistor M3 and that of the NMOS transistor M4 are supplied with the rectangular wave signals of the same phase.

When the gate voltages of the transistors M3 and M4 are at "L" level, only the transistor M3 is turned on and the current I1 is poured to the drive output terminal 20 as shown in FIG. 2E. When the gate voltages of the transistors M3 and M4 are at "H" level, only the tranor M4 is turned on and the current I2 is drawn from the drive output terminal 20 as shown in FIG. 2F. As a result of these operations, a high-frequency current $I_{out}(=I1+I2)$ having a phase opposite to that of the rectangular wave signal of the oscillation output of the G-VCO 17 shown in FIG. 2B and without DC offset is output from the drive output terminal 20 as shown in FIG. 2G.

The consumed current in the high-frequency current generating circuit 10 during the generation of a high-frequency current (while driving the laser diode 1) is only the sourcing current I1 shown in FIG. 2E and not the sinking current I2 shown in FIG. 2F. That is to say, the consumed current is an average (about ½ of the highest current value) of the sourcing current I1 and is far smaller than the amplitude $I_{P-P}$ (peak-peak value) of the high-frequency current $I_{out}$ output from the drive output terminal 20 as shown in FIG. 2G, i.e., about ¼ of the amplitude $I_{P-P}$. In case of the conventional high-frequency current generating circuit, when a high-frequency current of the same amplitude is to be output, an offset current of at least $I_{P-P}/2$ is required. In this embodiment, by contrast, such an offset current is not necessary and it is, therefore, possible to greatly reduce power consumption.

[Effects of Capacitors C1 and C2]

Next, description will be given to the effects of the gate-voltage stabilizing capacitors C1 and C2 included in the current sources 21 and 22 with reference to FIGS. 4 and 5.

The PMOS transistor M3 of the current switch 23 and the NMOS transistor M4 of the current switch 24 are repeatedly, alternately turned on and off as stated above. When the PMOS transistor M3 and the NMOS transistor M4 are turned on and off, the gate terminal of the NMOS transistor M1 in the sourcing current source 21 and the drain terminal of the NMOS transistor M2 in the sinking current source 22 have large voltage change with the same frequency as that of the oscillation output of the G-VCO 17.

If it is assumed that there is no gate-voltage stabilizing capacitors C1 and C2, high-frequency noise leaks into the gate voltages of the transistors M1 and M2, respectively, with different phases, through a parasitic capacitance due to the voltage change generated at the drain terminals of the transistors M1 and M2 in the above-stated current sources 21 and 22, respectively, with the result that a secondary distortion is generated in a high-frequency current output waveform from the drive output terminal 20. By inserting the gate-voltage stabilizing capacitors C1 and C2 into the current sources 21 and 22, respectively, it is possible to suppress such high-frequency noise and to improve the secondary distortion of the high-frequency current output waveform.

Figure 4:
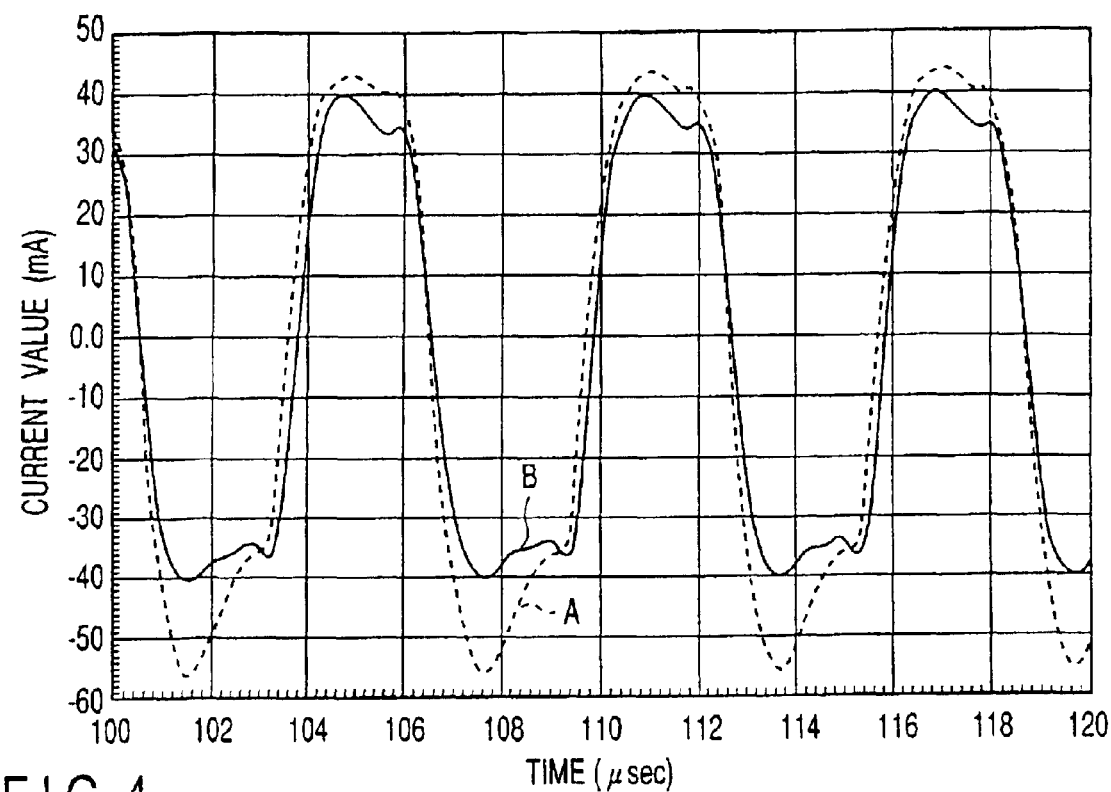
FIG. 4 shows the waveforms of high-frequency current outputs in a case where gate-voltage stabilizing capacitors shown in FIG. 3 are inserted and a case where they are not inserted, respectively.

FIG. 4 shows high-frequency current output waveforms in a case where the gate-voltage stabilizing capacitors C1 and C2 are not inserted and a case where they are inserted, as a curve A (broken line) and a curve B (solid line), respectively. As can be seen from FIG. 4, the unbalance between the peak value and the bottom value of the high-frequency current is greatly improved and the secondary distortion is reduced by the insertion of the gate-voltage stabilizing capacitors C1 and C2.

Figure 5:
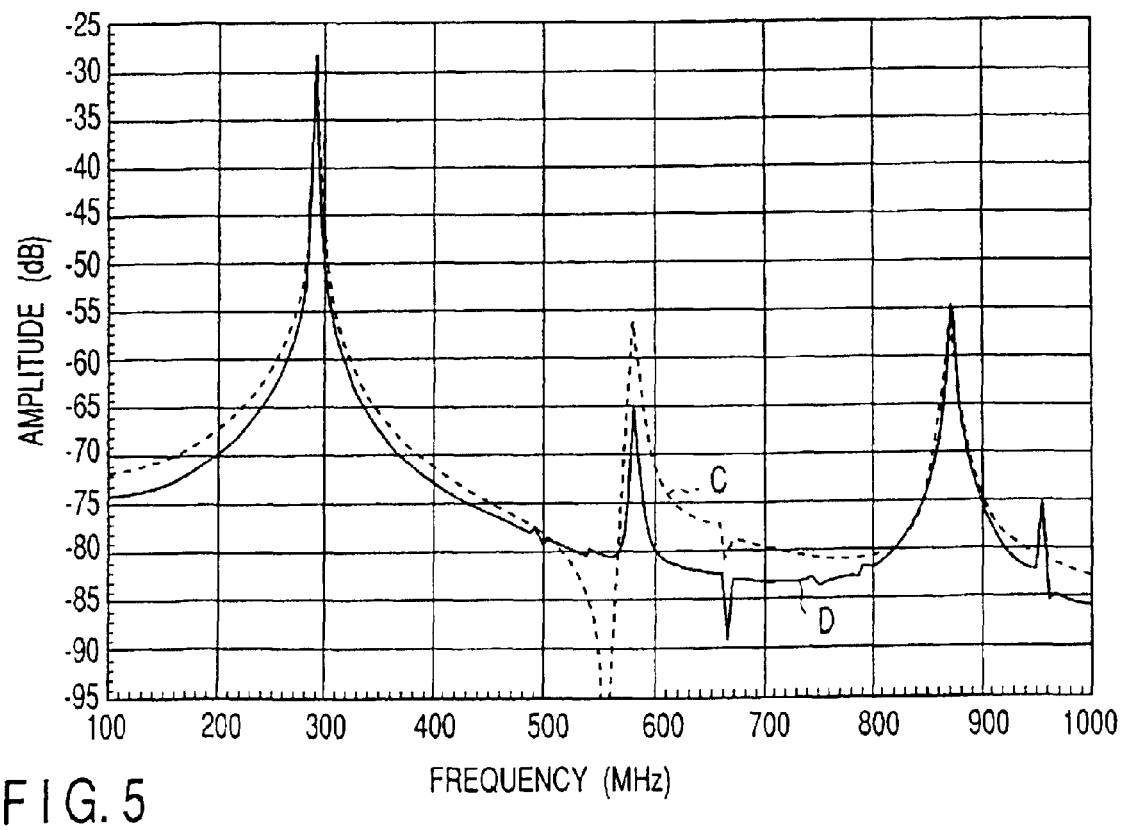
FIG. 5 shows the frequency spectrums of high-frequency current outputs in a case where the gate-voltage stabilizing capacitors shown in FIG. 3 are inserted and a case where they are not inserted, respectively.

FIG. 5 show frequency spectrums in a case where the gate-voltage stabilizing capacitors C1 and C2 are not inserted and a case where they are inserted as a curve C (broken line) and a curve D (solid line), respectively. As can be seen from FIG. 5, the secondary distortion is improved and low frequency noise is improved by the insertion of the gate-voltage stabilizing capacitors C1 and C2.

[Effects of Band-limiting Resistors R11 to R14]

Next, description will be given to the effects of the band-limiting resistors R11, R12, R13 and R14 with reference to FIGS. 6 and 7.

As already stated above, if the band-limiting resistors R11 and R12, and R13 and R14 are inserted into the OR gate 26 and the AND gate 27, respectively, the high-frequency components of a rectangular wave signal which is the oscillation output of the G-VCO 17 are removed by the band limiting functions of the gate-input capacitances Cap of the PMOS transistor M3 of the current switch 23 and the NMOS transistor M4 of the current switch 24. Then the rise and fall response characteristics of drive switching signals supplied to the gate terminals of the transistors M3 and M4 are deteriorated, thereby making it possible to reduce switching noise leaking into the drive output terminal 20 and to suppress noise leaking to the gates of the respective MOS transistors of the current sources.

Figure 6:
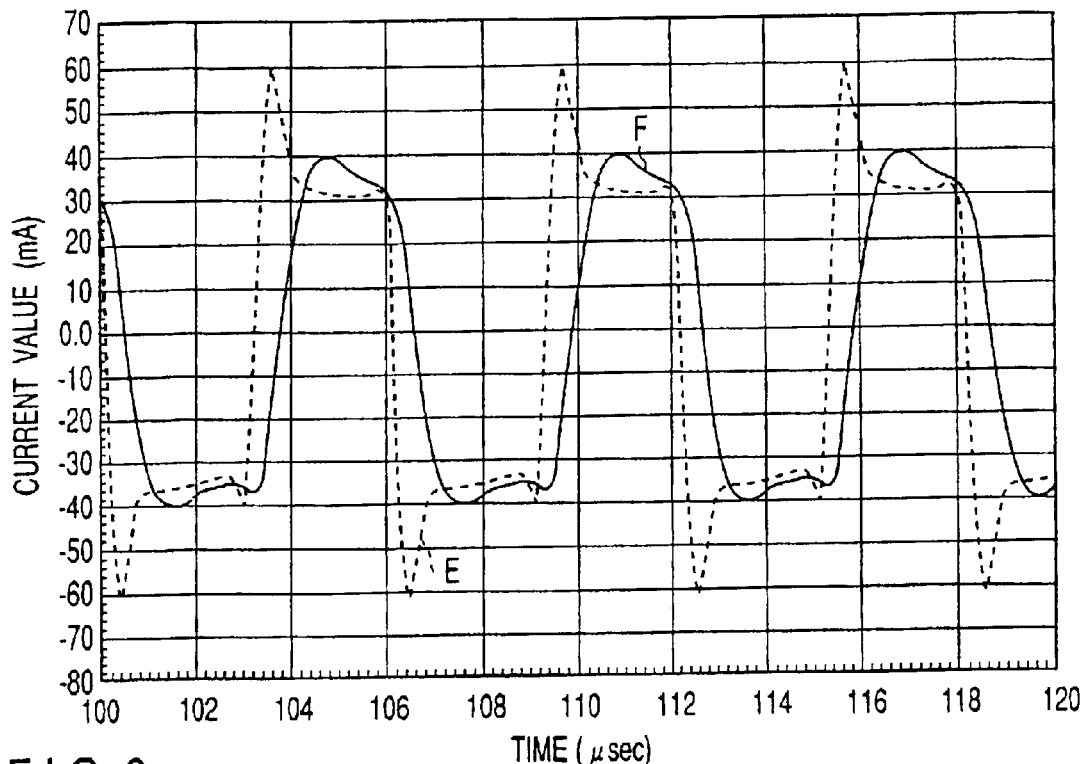
FIG. 6 shows the waveforms of high-frequency current outputs in a case where band-limiting resistors for drive switching signal shown in FIG. 3 are inserted and a case where they are not inserted, respectively.

FIG. 6 shows high-frequency current output waveforms in a case where the band-limiting resistors R11, R12, R13 and R14 are not inserted and a case where they are inserted as a curve E (broken line) and a curve F (solid line), respectively. As can be seen from FIG. 6, switching noise is greatly improved by the insertion of the band-limiting resistors R11, R12, R13 and R14.

Figure 7:
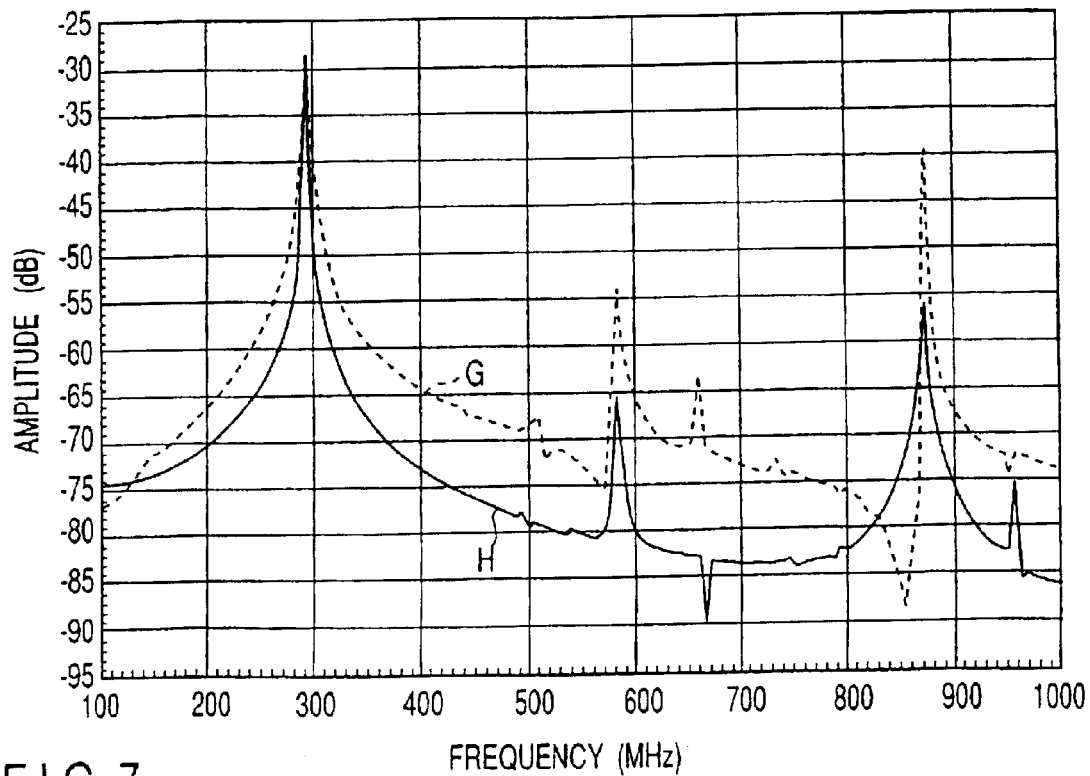
FIG. 7 shows the frequency spectrums of high-frequency current outputs in a case where band-limiting resistors for drive switching signal shown in FIG. 3 are inserted and a case where they are not inserted, respectively.

FIG. 7 shows the frequency spectrums of high-frequency current outputs in a case where the band-limiting resistors R11, R12, R13 and R14 are not inserted and a case where they are inserted as a curve G (broken line) and a curve H (solid line), respectively. As can be seen from FIG. 7, the secondary and tertiary distortions of the high-frequency current outputs are greatly improved by the insertion of the band-limiting resistors R11, R12, R13 and R14. Also, since the spectrums of the fundamental waves of the high-frequency current outputs are sharp, it is possible to output high-frequency currents of high quality.

While the secondary distortion is required to be suppressed since it may adversely influence other equipment as unnecessary radiation noise, the insertion of the gate-voltage stabilizing capacitors C1 and C2 and the band-limiting resistors R11, R12, R13 and R14 can suppress the secondary distortion quite effectively.

[G-VCO 17]

Next, description will be given to the concrete circuit arrangement of the G-VCO (gated-voltage controlled oscillator) 17 with reference to FIG. 8.

Figure 8:
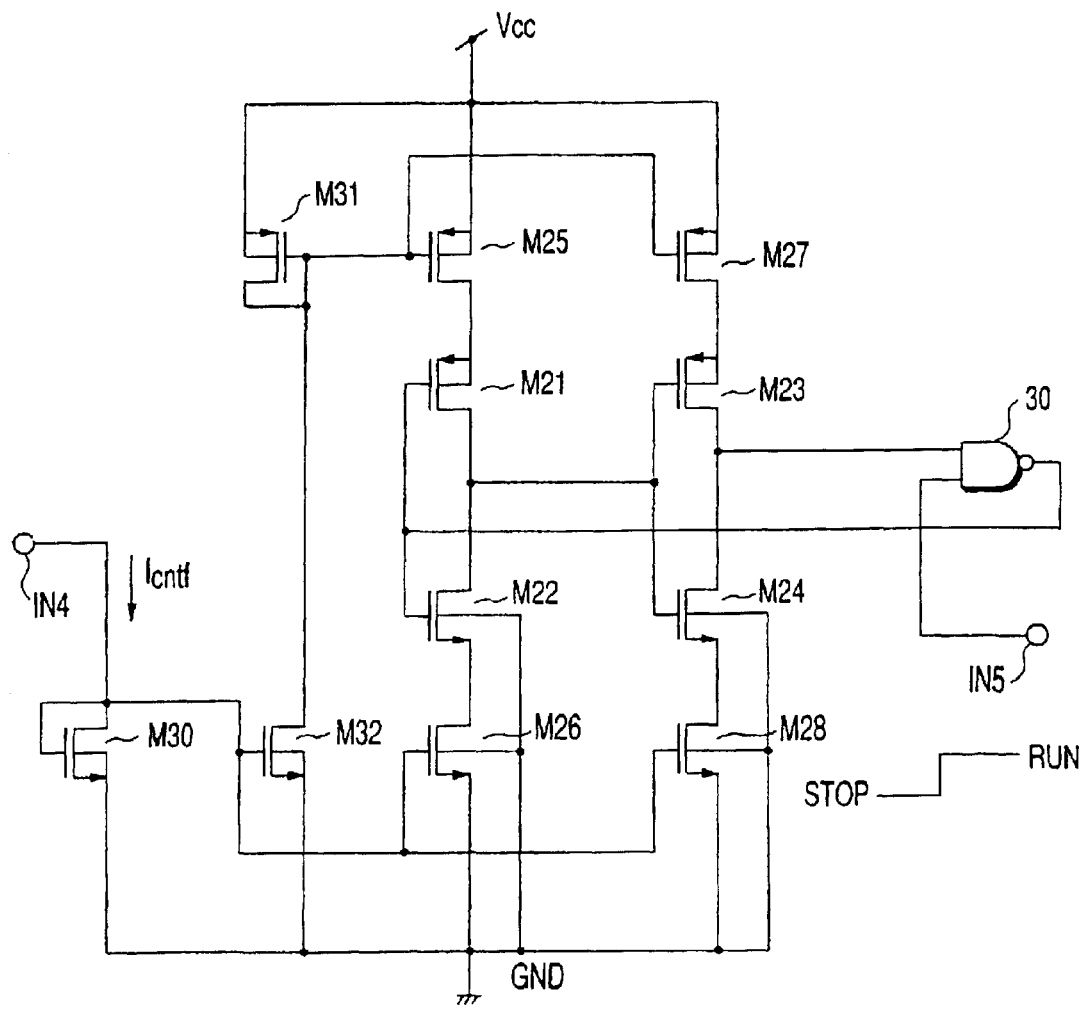
FIG. 8 is a circuit diagram showing the concrete configuration of a gated-voltage controlled oscillator shown in FIG. 3.

As shown in FIG. 8, a pair of a PMOS transistor M21 and an NMOS transistor M22 constitute the first inverter. A pair of a PMOS transistor M23 and an NMOS transistor M24 constitute the second inverter. The output of the first inverter is connected to the input of the second inverter. The output of the second inverter is connected to one of the inputs of an NAND gate 30 and the output of the NAND gate 30 is fed back to the input of the first inverter. In this way, a ring oscillator including two inverters is constituted.

A current source constituted by a PMOS transistor M25 and a current source constituted by an NMOS transistor M26 are connected to power source Vcc and earthed GND, respectively. Likewise, a current source constituted by a PMOS transistor M27 and a current source constituted by an NMOS transistor M28 are connected to power source Vcc and earthed GND.

By making the values of currents supplied to the first and second inverters variable by these current sources, the intensity of the delay of the inverters (determined by the current and gate parasitic capacitance) are changed and oscillation frequencies thereby become variable.

That is to say, a frequency-setting current $I_{cntf}$ from the voltage-to-current conversion circuit 14 shown in FIG. 1 is supplied to a frequency-control input terminal IN4 and supplied to the gate terminal of a diode-connected NMOS transistor M30, thereby converting the current into a voltage. The resultant voltage is then supplied to the gate terminal of an NMOS transistor M32 forming, together with the NMOS transistor M30, a current mirror, and to the gate terminals of the NMOS transistors M26 and M28.

After the frequency-setting current $I_{cntf}$ is inverted by the NMOS transistor M32, the inverted current is supplied to the gate terminal of a diode-connected PMOS transistor M31, thereby converting the current into a voltage. The voltage is then supplied to the gate terminals of the PMOS transistors M25 and M27 which transistors form, together with the PMOS transistor M31, a current mirror. With this configuration, it is possible to change an oscillation frequency according to the frequency-setting current $I_{cntf}$.

Meanwhile, a state-determining signal from the voltage comparator 18 shown in FIG. 1 is input, as a gate control signal, into a input terminal for controlling a gate IN5 and after that process, feedback signal is supplied to the other input terminal of the NAND gate 30. The NAND gate 30 is inserted into the feedback path of the ring oscillator. When the gate control signal is at "H" level (RUN), i.e., the laser diode 1 is in an operating state, the output of the second inverter is fed back to the input of the first inverter, thereby turning on an oscillating operation. When the gate control signal is at "L" level (STOP), i.e., the laser diode 1 is in an non-operating state, the output of the second inverter is blocked by the NAND gate 30 and not fed back to the input of the first inverter, thereby turning off the oscillating operation.

The above-stated configuration can ensure that the oscillating operation is carried out while the laser diode 1 is in an operating state. Namely, if there is no gate function of the NAND gate 30, the circuit is constituted by three stages of inverters and carries out a negative-feedback operation. Due to this, there is a possibility that the electric potential possessing circuit is stabilized with a middle value of electric potential after power is turned on and that no oscillation occurs. The above-stated configuration, by contrast, can ensure that the G-VCO 17 is set in an oscillation state by the gate function of the NAND gate 30 as well as the gate control signal used as an oscillation trigger, whereby it is possible to prevent the circuit from being stabilized with a middle value of electric potential and the above stated disadvantages can be overcome.

(Second Embodiment)

Figure 9:
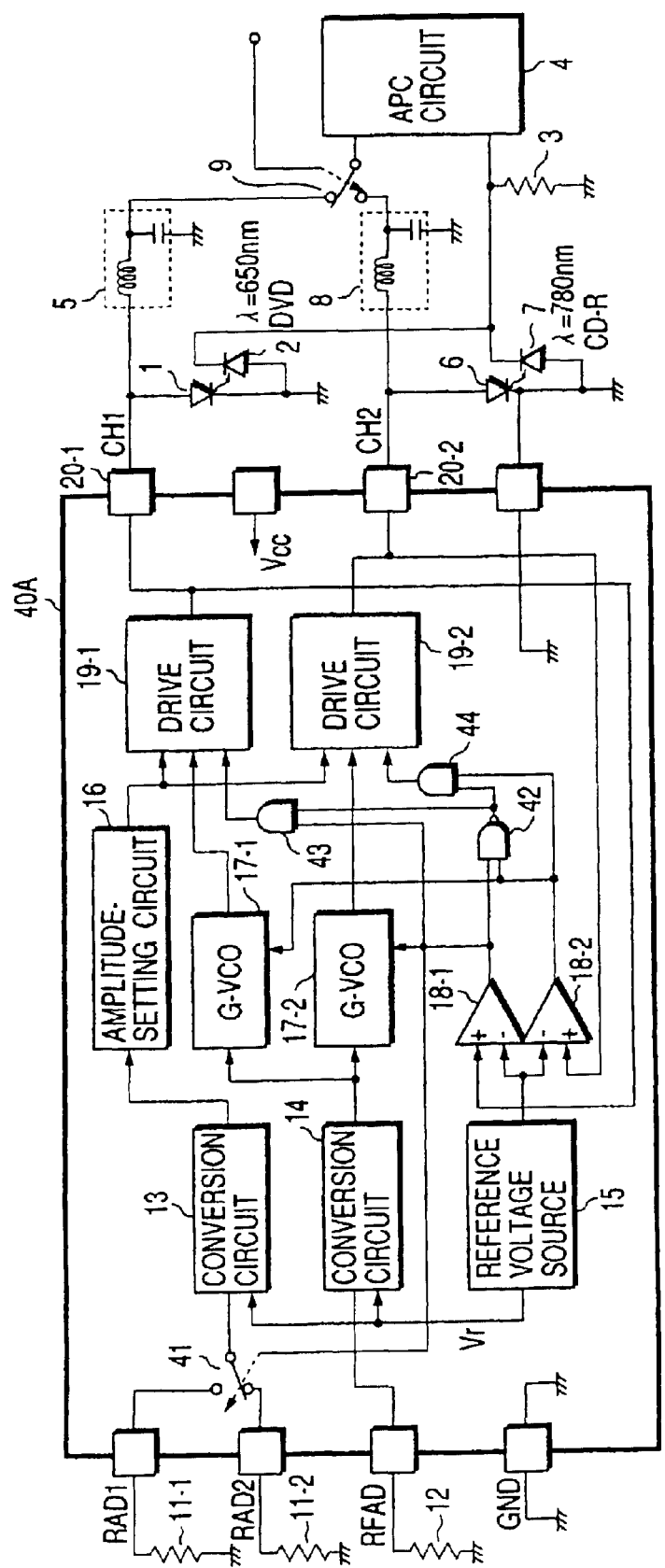
FIG. 9 is a circuit diagram showing the schematic configuration of a semiconductor device including a high-frequency current generating circuit according to the second embodiment of the present invention.

Now, the second embodiment of the present invention will be described with reference to FIG. 9. FIG. 9 shows an example of applying the present invention to a semiconductor device for selectively driving two laser diodes emitting light having a different wavelength.

Description will be given while the same constituent elements shown in FIG. 9 as those in FIG. 1 are denoted by the same reference symbols. In this embodiment, a laser diode 6 is provided in addition to the laser diode 1. It is assumed that the first laser diode 1 emits light at a light emission wavelength of, for example, λ=650 nm corresponding to a DVD and the second laser diode 6 emits light at a light emission wavelength of, for example, λ=780 nm corresponding to a CD-ROM.

In addition, a light-monitoring detector 7 of detecting light intensity and a high-frequency blocking filter 8 are newly provided, corresponding to the addition of the second laser diode 6. The cathode terminals of the two light-monitoring detectors 2 and 7 are connected in common. The output currents of the light-monitoring detectors 2 and 7 are converted into voltages by a current-to-voltage conversion resistor 3 connected to the common cathode terminals and input into an APC circuit 4.

Since the two laser diodes are not employed simultaneously, a control current output from the AFC circuit 4 is switched by a switch 9 and selectively supplied to the laser diodes 1 and 6 through the high-frequency blocking filters 5 and 8.

On the other hand, in a high-frequency current generating circuit 40A constituted by an integrated circuit, the amplitudes of the high-frequency currents supplied to the laser diodes 1 and 6 differ from each other so as to obtain a desired superposition effect of high-frequency current. Thus, the high-frequency current generating circuit 40A is provided with a resistor switch 41 switching current-amplitude setting resistors 11-1 and 11-2 of two external resistors, respectively which are prepared to be allowed to set amplitudes independently of each other and to connect one of the resistors 11-1 and 11-2 to a voltage-to-current conversion circuit 13. In addition, two G-VCO 17-1 and 17-2 and two drive circuits 19-1 and 19-2 are provided so as to supply high-frequency currents to the two laser diodes 1 and 6 independently of each other.

The high-frequency current generating circuit 40A is also provided with two voltage comparators 18-1 and 18-2 for comparing the terminal voltages of drive output terminals 20-1 and 20-2 with a reference voltage Vr from a reference voltage source 15, respectively so as to automatically switch a high-frequency current superimposed on a control current to be supplied to the laser diodes 1 or 6 depending on which of the laser diodes 1 and 6 is in an operating state. That is, only when the laser diode 1 or 6 is in an operating state in accordance with the state-determining signals output from the voltage comparators 18-1 and 18-2, respectively, the corresponding G-VCO 17-1 or 17-2 is controlled to conduct an oscillating operation and the corresponding drive circuit 19-1 or 19-2 is controlled to be turned on.

The output of the comparator 18-1 is also supplied to the above-stated resistor switch 41 as a switching signal. That is, the output of the comparator 18-1 is at "H" level only when the laser diode 1 is in an operating state. At this time, the resistor switch 41 selects the current-amplitude setting resistor 11-1 and connects the resistor 11-1 to the voltage-to-current conversion circuit 13. Also, the output of the comparator 18-1 is at "L" level only when the laser diode 1 is in a non-operating state, i.e., the laser diode 6 is in an operating state, and the both laser diodes 1, 6 are in an operating state. At this time, the resistor switch 41 selects the current-amplitude setting resistor 11-2 and connects the resistor 11-2 to the voltage-to-current conversion circuit 13.

Furthermore, the high-frequency current generating circuit 40A is provided with an NAND gate 42 and AND gates 43 and 44 so as to prevent the two drive circuits 19-1 and 19-2 from operating simultaneously for some reasons. That is, the NAND gate 42 applies "L" level to the AND gates 43 and 44 when state-determining signals from the both voltage comparators 18-1 and 18-2 are at "H" level, thereby forcedly stopping the operations of the drive circuit 19-1 and 19-2 irrespectively of the state-determining signals.

As can be seen from the above, according to this embodiment, in the high-frequency current generating circuit 40A corresponding to the laser diodes 1 and 6 emitting light having a different wavelength respectively, the voltageto-current conversion circuits 13 and 14 for setting the amplitude and frequency of a high-frequency current are used for the two wavelengths in common. By doing so, it is possible to prevent a circuit from becoming large in size and to realize cost reduction. Besides, the NAND gate 42 and the AND gates 43 and 44 can prevent malfunction if the two laser diodes 1 and 6 which do not intrinsically operate simultaneously are erroneously determined to be in an operating state.

The high-frequency current generating circuit in this embodiment is also effective for employing one laser diode which selectively emits light of two wavelengths.

(Third Embodiment)

Figure 10:
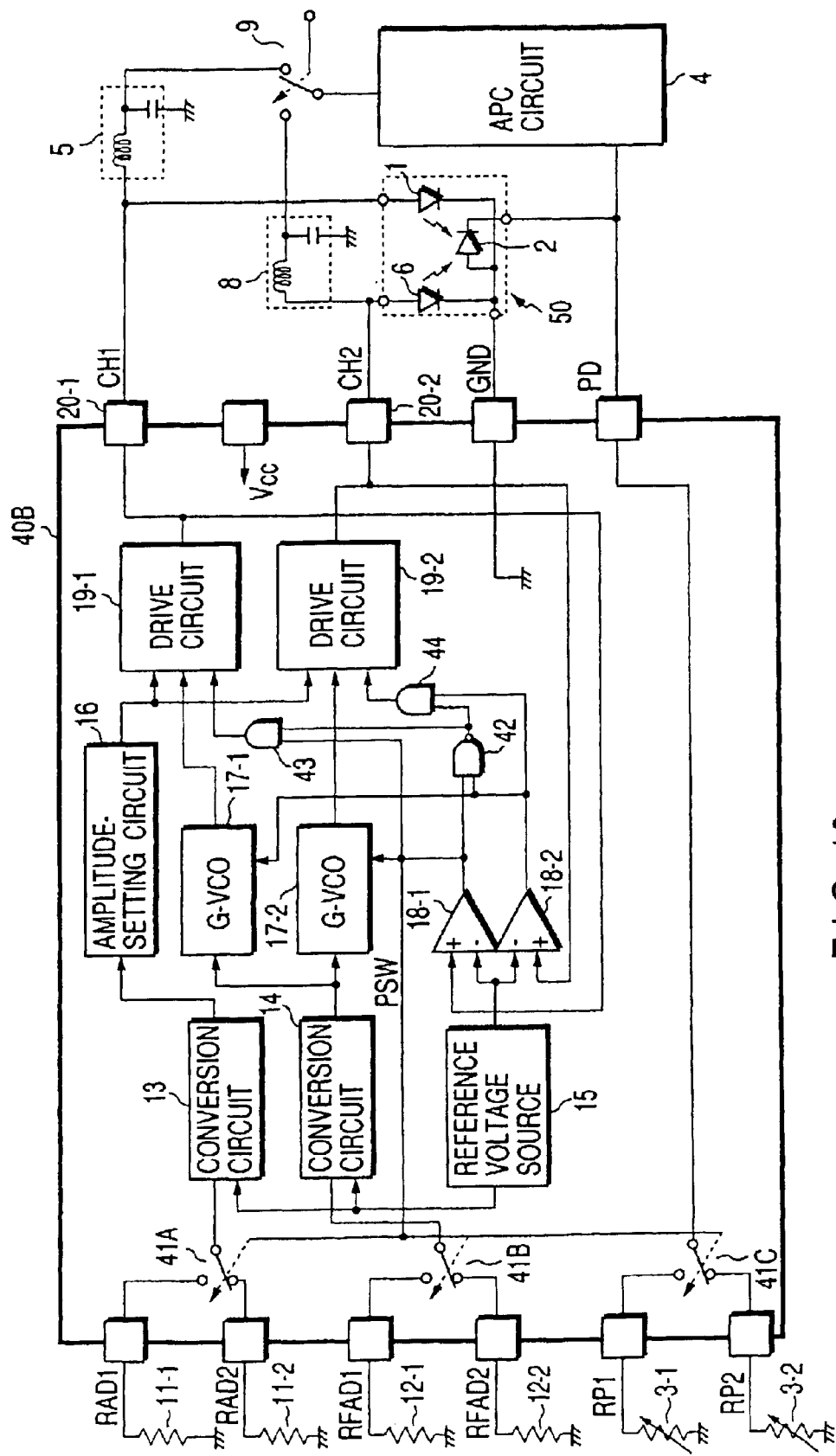
FIG. 10 is a circuit diagram showing the schematic configuration of a semiconductor device including a high-frequency current generating circuit according to the third embodiment of the present invention.

Now, the third embodiment of the present invention will be described with reference to FIG. 10. This embodiment concerns, as in the case of the second embodiment, a case where the present invention is applied to a semiconductor device for selectively driving two laser diodes having a different light emission wavelength, respectively.

Description will be given hereinafter, while the same constituent elements in FIG. 10 as those shown in FIG. 9 are denoted by the same reference symbols. In the embodiment shown in FIG. 9, light-monitoring detectors 2 and 7 for detecting light intensity corresponding to the two laser diodes 1 and 6 are provided, respectively. In this embodiment, by contrast, one common light-monitoring detector 2 receives light beams emitted from laser diodes 1 and 6.

Figure 11A:
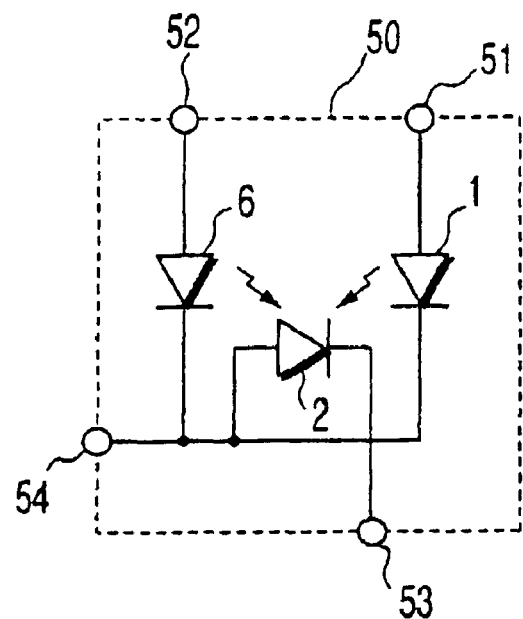
FIGS. 11A and 11B show the schematic and packaging structures of a monolithic two-wavelength integrated laser diode having laser diodes of two wavelengths formed on one chip and a light-monitoring detector.
Figure 11B:
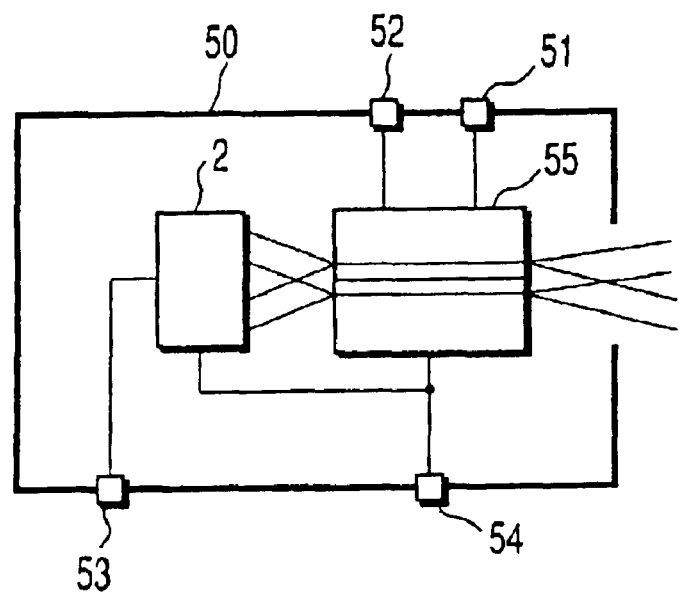

As shown in FIGS. 11A and 11B, the laser diodes 1 and 6 are so-called monolithic two wavelength integrated laser diodes (TWIN-LD). A light-monitoring detector 2 is so arranged as to detect a back emission light from the TWIN-LD 55. The TWIN-LD 55 and the light-monitoring detector 2 are packaged in a single package 50.

In this case, four input/output pins in all, i.e., pins 51 and 52 led out from the anode terminals of the two laser diodes 1 and 6 of the TWIN-LD 55, a pin 53 led out from the cathode terminal of the light detector 2 and a pin 54 led out in common from the cathode terminals of the laser diodes 1 and 6 and the anode terminal of the light detector 2, are provided in the package 50. This makes it possible to employ an existing production facility corresponding to the package of four-pin structure.

As stated above, if light-monitoring detectors corresponding to the two laser diodes within the TWIN-LD are individually provided, a optical device, such as a dichroic prism, for separating a light path of light of two wavelengths emitted from the TWIN-LD and introducing the light into the two light-monitoring detectors, which may possibly make the package large in size. When the light emitted from the two laser diodes 1 and 6 are received by a common light intensity light-monitoring detector 2 as described in this embodiment, such an optical device is not required.

As can be seen, if the common light-monitoring detector 2 detects light beams emitted from the two laser diodes 1 and 6, the first and second current-to-voltage conversion resistors 3-1 and 3-2 corresponding to the respective laser diodes 1 and 6 are provided as external resistors of the high-frequency current generating circuit 40B comprised of an integrated circuit so as to individually control the light intensity of the laser diodes 1 and 6. These resistors 3-1 and 3-2 are preferably variable resistors.

On the other hand, the high-frequency current generating circuit 40B is provided with the third resistor switch 41C for switching the current-to-voltage conversion resistors 3-1 and 3-2 and connecting one of them to the APC circuit 4.

The third resistor switch 41C connects the current-to-voltage conversion resistor 3-1 to the APC circuit 4 when only the laser diode 1 is in an operating state by supplying the output of the comparator 18-1 as a switching signal PSW.

In that case, it is considered operationally strange if, after the APC circuit starts an APC operation, the operation states of the laser diode 1 and 6 are detected and the switch 41C functions to close an APC loop. However, the detecting speeds of the comparators 18-1 and 18-2 and the operating speed of the switch 41C are far faster than that of the response operation of the APC. Further, if a current flows through the laser diodes 1 and 6, the comparators 18-1 and 18-2 promptly detect that the laser diodes 1 and 6 turn into an operating state before the diodes 1 and 6 actually emit light, so that there is no fear that undesired operation is carried out during the transient state of the APC operation.

With such a configuration, the light intensity of the laser diodes 1 and 6 can be individually set by individually adjusting the values of the current-to-voltage conversion resistors 3-1 and 3-2. In other words, even if the sensitivity of the common light intensity light-monitoring detector 2 has wavelength selectivity with respect to light beams of a different wavelength emitted from the respective laser diodes 1 and 6, it is possible to set the light intensity of the laser diodes 1 and 6 at optimum values for different media such as a DVD and a CD by adjusting the values of the current-to-voltage conversion resistors 3-1 and 3-2.

Moreover, in the second embodiment shown in FIG. 9, the current-amplitude setting resistors 11-1 and 11-2 are individually provided to correspond to the laser diodes 1 and 6. In this embodiment, frequency-setting resistors 12-1 and 12-2 are also individually provided to correspond to the laser diodes 1 and 6 These frequency-setting resistors 12-1 and 12-2 are switched by the second resistor switch 41B operating if the output of the comparator 18-1 is supplied as a switch switching signal PSW as in the case of the first resistor switch 41A for switching the current-amplitude setting resistors 11-1 and 11-2 and connecting one of them to the voltage-to-current conversion circuit 13 and the third resistor switch 41C for switching the current-to-voltage conversion resistors 3-1 and 3-2 and connecting one of them to the APC circuit 4.

That is to say, when only the laser diode 1 is in an operating state, the second resistor switch 41B connects the frequency-setting resistor 12-1 to the voltage-to-current conversion circuit 14. When only the laser diode 6 is in an operating state, the second resistor switch 41B connects the frequency-setting resistor 12-2 to the voltage-to-current conversion circuit 14. It is, therefore, possible to set the frequencies of the high-frequency currents supplied to the two laser diodes 1 and 6 at optimum values, respectively for obtaining a desired superposition effect of high-frequency current.

A As can be understood from the above description, according to this embodiment, there is provided a light intensity control device which consists of a common monitoring detector 2 for detecting the intensity of light emitted from the laser diodes 1 and 6. This control device selectively turns into an operating P state. The control device includes first and second current-to-voltage conversion resistors 3-1 and 3-2 provided to convert the current output from the light detector into a voltage and correspond to the laser diodes 1 and 6, a comparator 18-1 for determining which laser diode is in an operating state, the laser diode 1 or 2, a resistor switch 41C for selecting from the current-to-voltage conversion resistors 3-1 and 3-2. One resistor switch corresponding to the laser diode is determined to be in an operating state by the comparator 18-1, and an APC circuit 4 controls the light intensity of the laser diodes 1 and 6 based on the voltage obtained by converting a current into a voltage by the current-to-voltage conversion resistor selected by the resistor switch 41G. Thus, it is possible to individually control the light intensity for the respective laser diodes 1 and 6 while employing the common light intensity light-monitoring detector 2.

Accordingly, one light-monitoring detector 2 is provided to be common to the laser diodes 1 and 6. As a result, the number of pins of the package 50 may be four and light beams with a respective wavelength emitted from the TWIN-LD 55 having the laser diodes 1 and 6 provided on one chip can be introduced to the single light-monitoring detector 2 without separating an optical path for the light beams with the respective wavelength. Thus, an optical device such as a dichroic prism is not required and the package 50 can be made small in size. This contributes to an smaller, lighter optical pickup as a whole.

(Fourth Embodiment)

Figure 12:
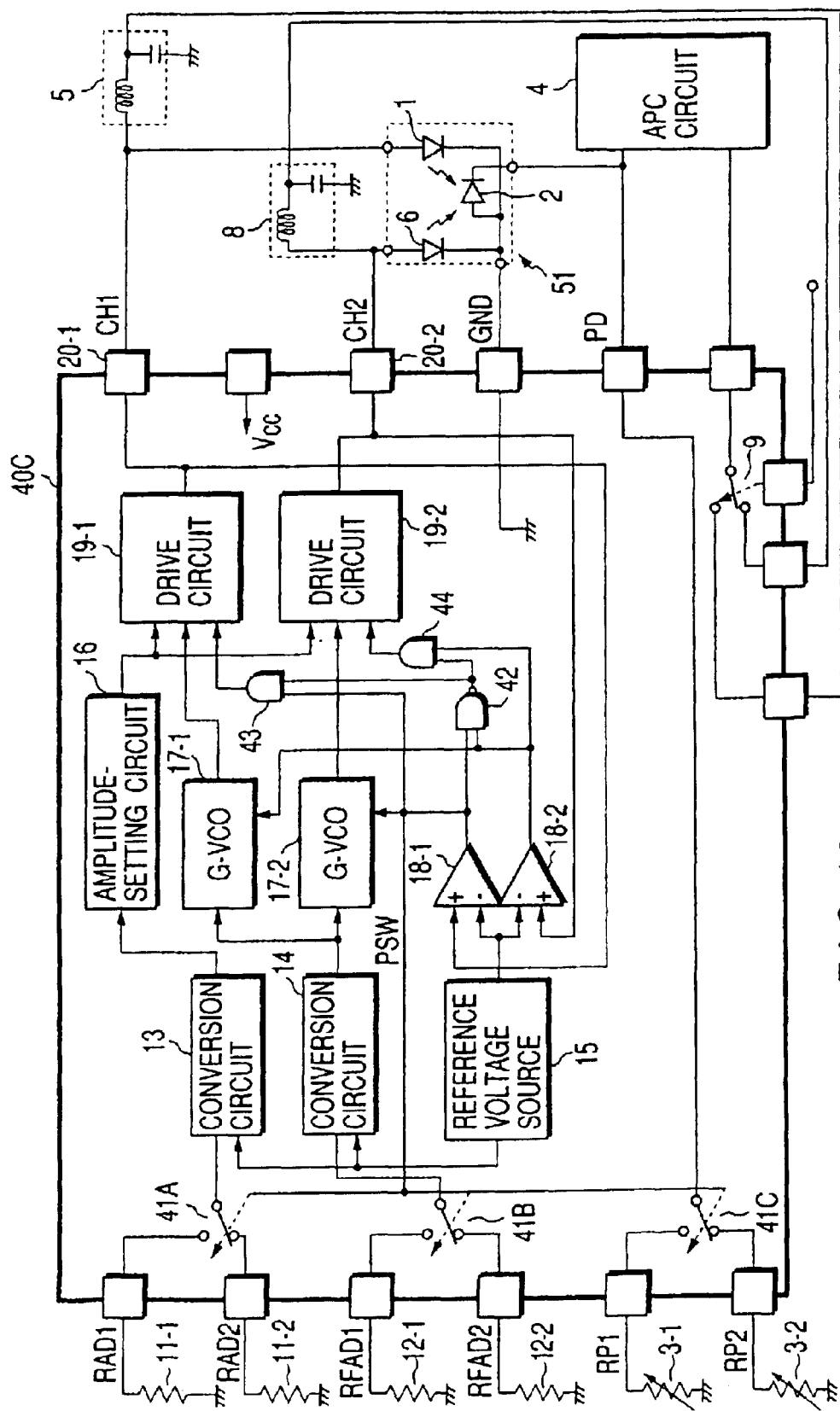
FIG. 12 is a circuit diagram showing the schematic configuration of a semiconductor device including a high-frequency current generating circuit according to the fourth embodiment of the present invention.

FIG. 12 shows the fourth embodiment of the present invention. In the second and third embodiments already described above, the switch 6 for switching control currents to be supplied a control current from the APC circuit 4 is provided externally of the high-frequency current generating circuit 40A, 40B.

In this embodiment, by contrast, a switch 9 is provided inside a high-frequency current generating circuit 40C constituted by an integrated circuit. However, the switch 9 is controlled by a control signal supplied from an external unit, e.g., an optical disk set, into the high-frequency current generating circuit 40C. The configuration of the high-frequency current generating circuit 40C in this embodiment is the same as that in the third embodiment except that the switch 9 is included in the circuit 40C as stated above, which detailed description will not be, therefore, given herein.

(Fifth Embodiment)

Figure 13:
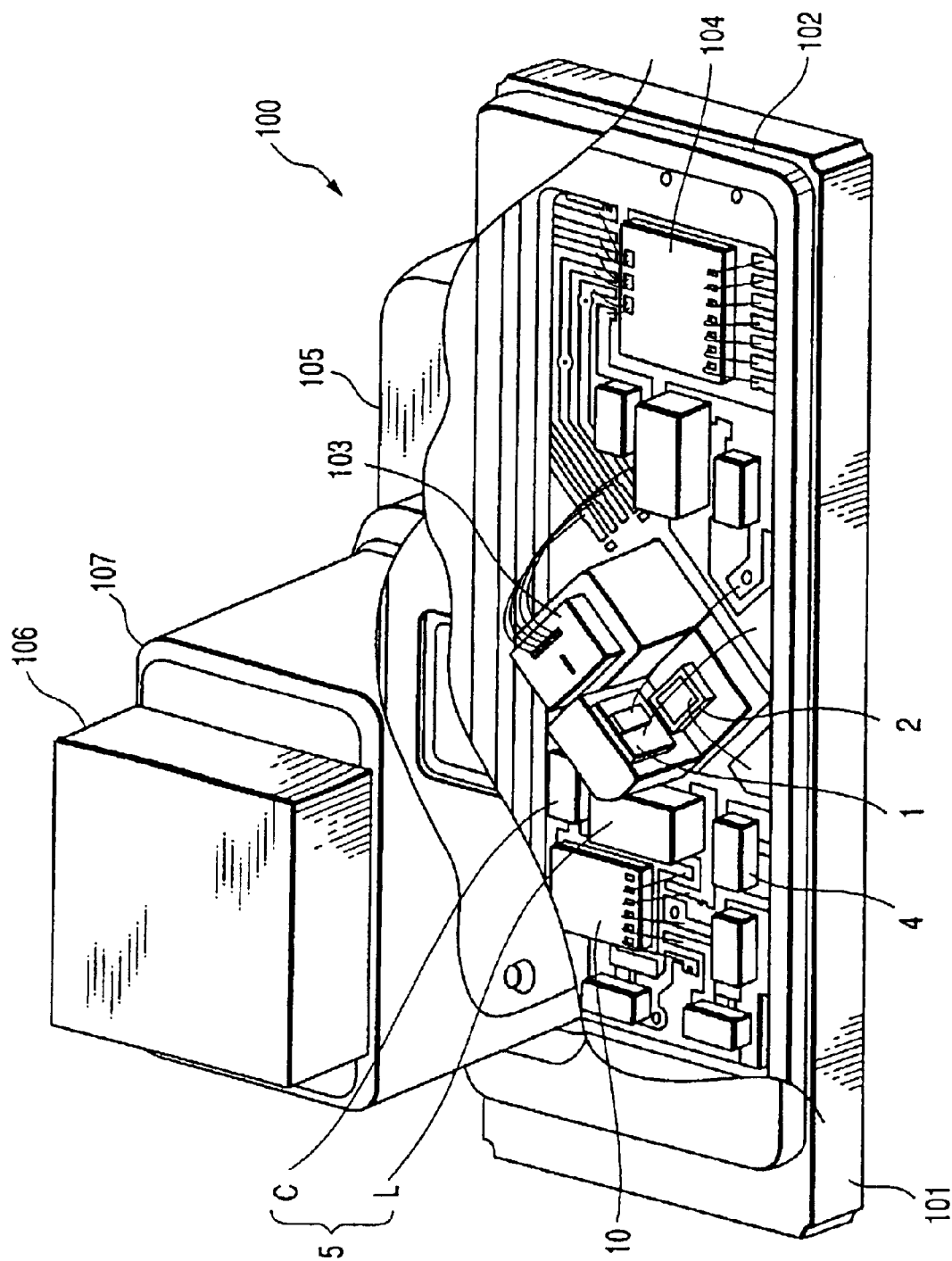
FIG. 13 is a perspective view showing the internal configuration of an optical system unit included in optical pickup device according to the fifth embodiment of the present invention.

Next, description will be given to an optical system unit according to the present invention as the fifth embodiment of the present invention. FIG. 13 is a perspective view showing the internal configuration of an optical system unit 10.

FIG. 13 will be described, while centering around the portions relating to the present invention. A laser diode 1 constituting a semiconductor device described in the first embodiment (or a TWIN-LD 55 having the laser diodes 1 and 6 formed on one chip described in the third and fourth embodiments), a light-monitoring detector 2, an integrated APC circuit 4, a high-frequency blocking filter 5 and a high-frequency current generating circuit 10 (or high-frequency current generating circuits 40B and 40B described in the third and fourth embodiments) as well as a reproduction light detector 103 and a head amplifier 104 are mounted on a case 102 on a ceramic substrate 101 and wirings are given thereon by bonding wires. A cover 105 is provided on the case 102 and a polarization hologram element 106 and a polarization light prism 107 are arranged on the cover 105.

This optical system unit 100 comprises the high-frequency current generating circuit 10 (or high-frequency current generating circuits 40B and 40C) already described above. Therefore, the unit 100 is characterized by that power consumption is quite low, the temperature rise of the laser diode and a drive system thereof can be prevented and a smaller, lighter unit can be easily realized.

(Sixth Embodiment)

Figure 14:
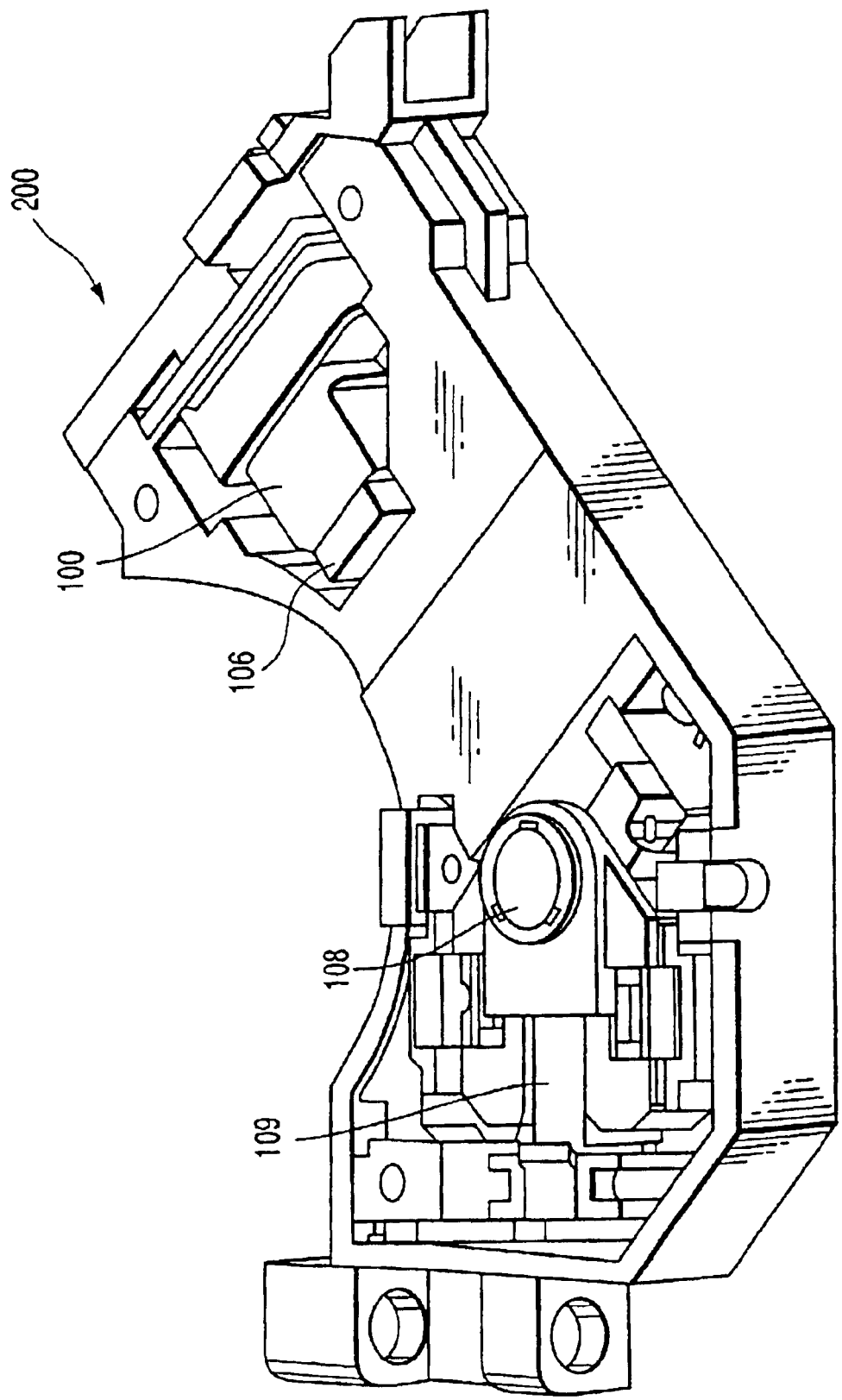
FIG. 14 is a perspective view showing the internal configuration of an optical pickup device according to the sixth embodiment of the present invention.

Next, as the sixth embodiment of the present invention, an optical pickup device according to the present invention will be described. FIG. 14 is a perspective view showing the internal configuration of an optical pickup device 200 including the optical system unit 100 described with reference to FIG. 13.

In the optical system unit 100, a laser beam emitted from a laser diode 1 transmits a polarization hologram element 106 and is applied onto an optical disk which is not shown in FIG. 14, e.g., a DVD by way of an objective lens 108.

A reflection light from the optical disk is incident on the reproduction light detector 103 shown in FIG. 13 by taking the opposite path to that of the emission light of the laser diode 1, i.e., by way of the objective lens 108 and the polarization hologram element 106 in this order. The reproduction light detector 103 is, for example, a 6-channel photodiode having a light receiving surface divided into six segments. The output of the detector 103 is amplified by a head amplifier 104 shown in FIG. 13 and also subjected to a predetermined operation processing, thereby generating a focus error signal and a tracking error signal.

Based on the focus error signal and the tracking error signal, a lens actuator 109 is controlled by a servo circuit which is separately provided and not shown in FIG. 14. The lens actuator 109 drives the objective lens 108 in focus and tracking directions, thereby conducting focus control and tracking control.

In this control state, the reproduction signals of information recorded as pits on the optical disk are generated in the head amplifier 104 and output as reproduction data after being subjected to equalization, binary, demodulation and decoding processings by a reproduction signal processing system which is not shown in FIG. 14. The reproduction data is, for example, transferred to a personal computer or converted into a video signal in a predetermined format and taken out as an output of a DVD player.

The optical pickup device 200 employs the optical system unit 100 including the high-frequency current generating circuit 10 (or high-frequency current generating circuits 40B and 40C) already described above. Due to this, the optical pickup device 200 is capable of lowering consumption current, preventing temperature rise and being provided as a smaller, lighter device. Besides, the high-frequency current generating circuit 10 is arranged in the neighborhood of the laser diode 1, thereby making it possible to read data at high transfer rate.

As described so far, according to the high-frequency current generating circuit of the present invention, it is possible to greatly increase the amplitude of a high-frequency current and to decrease current consumption to thereby reduce a heating value, the current generating circuit constituting the high-frequency current generating circuit for generating a high-frequency current to be superimposed on a control current for a laser diode while suppressing power consumption, out of the first sourcing current source, the second sinking current source, the first and second current switches connected between the first and second current sources and the output terminal of the high-frequency current generating circuit, respectively, an oscillation circuit oscillating with a desired frequency, and a drive circuit for complementarily on/off controlling the first and second switches in accordance with the output signal of the oscillation circuit.

Further, another high-frequency current generating circuit according to the present invention is capable of generating a high-frequency current to be superimposed on a control current for a laser diode with two wavelengths using a single light intensity light-monitoring detector.

Furthermore, the light intensity controller of laser diode according to the present invention is capable of individually controlling the light intensity of laser diodes with two wavelengths using a single light-monitoring detector and thereby contributing to providing a smaller, lighter optical disk device.

Moreover, according to the present invention, it is possible to provide an optical system unit which requires smaller current consumption and can be easily made smaller, thinner and lighter, and an optical pickup device including the optical system unit by employing the above-stated high-frequency current generating circuit based on the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-frequency current generating circuit for generating a high-frequency currant, incorporated into a driving device for driving a laser diode by using a drive signal for driving one of first and second laser diodes having different wavelengths of emitting light obtained by superimposing said high-frequency current on a control current for controlling an output of said laser diode, said high-frequency current generating circuit comprising:
   a detection oscillation circuit configured to detect whether the first and second laser diodes are turned on/off while referring to a voltage value generated based on the control current, and output an oscillation signal corresponding to the wavelength of the laser diode being turned on; and
   two high-frequency current generation units configured to input an output signal of said detection oscillation circuit, and output the high-frequency current, wherein
   each of said two high-frequency current generation units comprises:
   an output terminal configured to output the high-frequency current;
   a first sourcing current source configured to generate a first current, and output the first current to said output terminal;
   a first current switch configured to control an output of the first current from said first sourcing current source to said output terminal, said first current switch being connected between said first sourcing current source and said output terminal;
   a second sinking current source configured to generate a second current, and input the second current from said output terminal;
   a second current switch configured to control an output of the second current from said second sinking current source to said output terminal, said second current switch being connected between said second sinking current source and said output terminal; and
   a control circuit configured to alternately on/off control said first and second current switches, said control circuit being connected to said first and
   a first current switch configured to control an output of the first current from said first sourcing current source to said output terminal, said first current switch being connected between said first sourcing current source and said output terminal;
   a second sinking current source configured to generate a second current, and input the second current from said output terminal;
   a second current switch configured to control an output of the second current from said second sinking current source to said output terminal, said second current switch being connected between said second sinking current source and said output terminal; and
   a control circuit configured to alternately on/off control said first and second current switches, said control circuit being connected to said first and second current switches.

2. A high-frequency current generating circuit according to claim 1, wherein
   each of said first and second current sources includes:
   a MOSFET for amplify a current due to a predetermined voltage input to a gate terminal of said MOSFET; and
   a capacitor for stabilize the voltage on the gate terminal of said MOSFET.

3. A high-frequency current generating circuit according to claim 1, wherein
   said detection oscillation circuit includes:
   a determination circuit configured to determine whether the first and second laser diodes are turned on or off While referring to a voltage value of said output terminal; and
   first and second oscillation circuits each configured to output the oscillation signal having the predetermined in accordance with a determining result of said determination circuit.

4. A high-frequency current generating circuit according to claim 1, further comprising:
   a first resistor-selecting element configured to select a resistor corresponding to the laser diode determined to be turned on, from first and second resistors, provided to correspond to the first and second laser diodes, respectively;
   a first voltage-to-current conversion circuit configured to generate a third current for setting an amplitude of the high-frequency current determined by a voltage due to one of the first and second resistors selected by said first resistor-selecting element and a reference voltage; and
   an amplitude setting circuit configured to adjust the amplitude of the high-frequency current by controlling current values of said first and second current sources based on the third current.

5. A high-frequency current generating circuit according to claim 1, further comprising a second voltage-to-current conversion circuit configured to generate a fourth current for setting a frequency of the high-frequency current determined by a voltage due to a third resistor and a reference voltage, said second voltage-to-current conversion circuit controlling an oscillation frequency of said detection oscillation circuit based on the fourth current.

6. A high-frequency current generating circuit according to claim 1, further comprising:
   a second resistor-selecting element configured to select a resistor corresponding to the laser diode determined to be turned on, from third and fourth resistors, provided to correspond to the first and second laser diodes, respectively; and a second voltage-to-current conversion circuit configured to generate a fourth current for setting a frequency of the high-frequency current determined by a voltage due to one of the third and fourth resistors selected by said second resistor-selecting element and a reference voltage, said second voltage-to-current conversion circuit controlling an oscillation frequency of said detection oscillation circuit based on the fourth current.

7. A high-frequency current generating circuit according to claim 1, further comprising a third resistor-selecting element configured to select one current-to-voltage conversion resistor corresponding to the laser diode determined to be turned on, from first and second current-to-voltage conversion resistors, provided to correspond to the first and second laser diodes, respectively, the first and second current-to-voltage conversion resistors converting a current into a voltage.

8. A high-frequency current generating circuit for generating a high-frequency current, comprising:
 a driving device including two high frequency current generation units configured to drive one of first and second laser diodes emitting light having different wavelengths; and
 a detection oscillation circuit configured to detect whether the first and second laser diodes are turned on/off while referring to a voltage value generated based on a control current, and configured to output an oscillation signal corresponding to a wavelength of the laser diode being turned on.

* * * * *